United States Patent
Lee et al.

(10) Patent No.: US 6,509,601 B1
(45) Date of Patent: Jan. 21, 2003

(54) SEMICONDUCTOR MEMORY DEVICE HAVING CAPACITOR PROTECTION LAYER AND METHOD FOR MANUFACTURING THE SAME

(75) Inventors: Yong-tak Lee, Kyungki-do (KR); Hag-ju Cho, Seoul (KR); Yeong-kwan Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/511,562

(22) Filed: Feb. 23, 2000

Related U.S. Application Data

(63) Continuation-in-part of application No. 09/127,353, filed on Jul. 31, 1998, now Pat. No. 6,144,060.

(30) Foreign Application Priority Data

Sep. 10, 1999 (KR) .............................. 99-38709
Dec. 29, 1999 (KR) .............................. 99-65074

(51) Int. Cl.[7] .............................................. H01L 29/72
(52) U.S. Cl. ...................... 257/310; 257/306; 257/324; 257/637; 257/790
(58) Field of Search ................................ 257/306, 310, 257/324, 637, 790

(56) References Cited

U.S. PATENT DOCUMENTS

| | | | | |
|---|---|---|---|---|
| 5,126,283 A | * | 6/1992 | Pintchovski et al. | 257/307 |
| 5,212,620 A | | 5/1993 | Evans, Jr. et al. | 361/313 |
| 5,330,931 A | | 7/1994 | Emesh et al. | 437/60 |
| 5,350,705 A | | 9/1994 | Brassington et al. | 257/295 |
| 5,426,075 A | | 6/1995 | Perino et al. | 437/235 |
| 5,434,742 A | | 7/1995 | Saito et al. | 361/321.5 |
| 5,438,023 A | | 8/1995 | Argos, Jr. et al. | 437/235 |
| 5,452,178 A | | 9/1995 | Emesh et al. | 361/303 |
| 5,638,319 A | * | 6/1997 | Onishi et al. | 257/306 |
| 5,639,316 A | | 6/1997 | Cabral, Jr. et al. | 147/277 |
| 5,717,233 A | * | 2/1998 | Fujii et al. | 257/637 |
| 6,211,542 B1 | * | 4/2001 | Eastep et al. | 257/637 |

FOREIGN PATENT DOCUMENTS

| | | |
|---|---|---|
| EP | 0 514 547 A1 | 11/1992 |
| EP | 0 642 167 A2 | 3/1995 |
| GB | 2 313 232 A | 11/1997 |
| GB | 2 336 468 A | 10/1999 |
| KR | 2000-0025706 | 5/2000 |

OTHER PUBLICATIONS

Notice to Submit Response, Korean Application No. 10–1999–0065074, Nov. 28, 2001.
A Half–Micron Ferroelectric Memory Cell Technology with Stacked Capacitor Structure, SHARP Corporation, IC–Group, VLSI Development Laboratories 2613–1, Ichinomoto–cho, Tenri–city, Nara 632, Japan, dated 1994.

* cited by examiner

*Primary Examiner*—Edward Wojciechowicz
(74) *Attorney, Agent, or Firm*—Myers Bigel Sibley & Sajovec

(57) ABSTRACT

A semiconductor memory device having a capacitor protection layer and a method for manufacturing the same. A capacitor of the semiconductor memory device is entirely covered with an encapsulating layer having a multi-layered structure. The encapsulating layer comprises at least a blocking layer and a capacitor protection layer, each of which is formed of different materials. The blocking is formed of a material capable of preventing a capacitor dielectric layer from volatilizing and/or capable of preventing a reaction between a material layer under the blocking layer and the capacitor protection layer. The capacitor protection layer is formed of a material layer capable of preventing diffusion of hydrogen into the capacitor dielectric layer. In addition, the semiconductor memory device may has a hydrogen barrier layer as another capacitor protection layer, between the capacitor and a passivation layer.

13 Claims, 16 Drawing Sheets

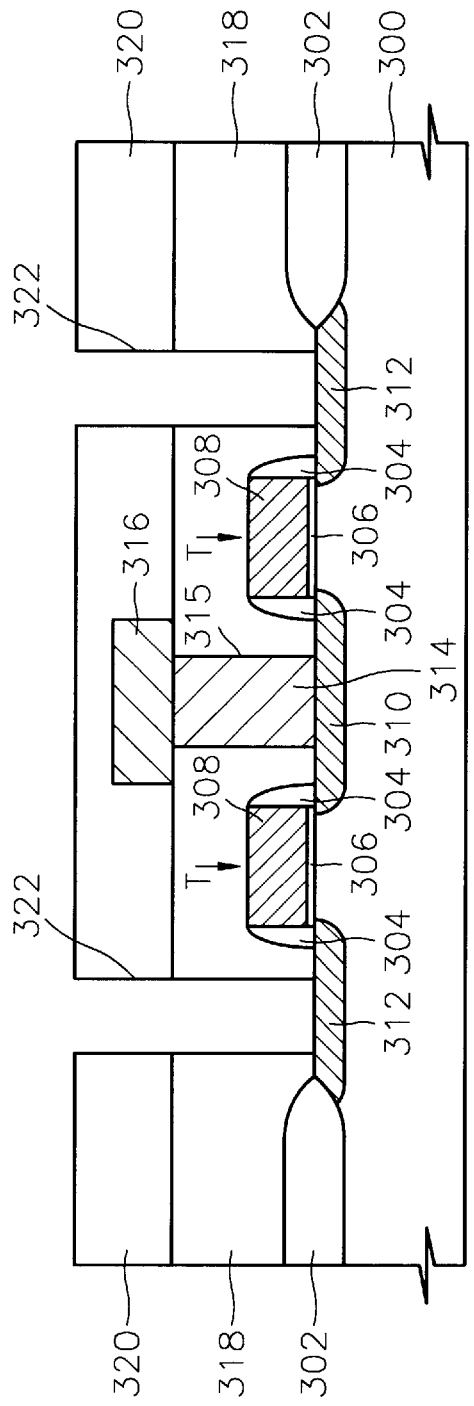
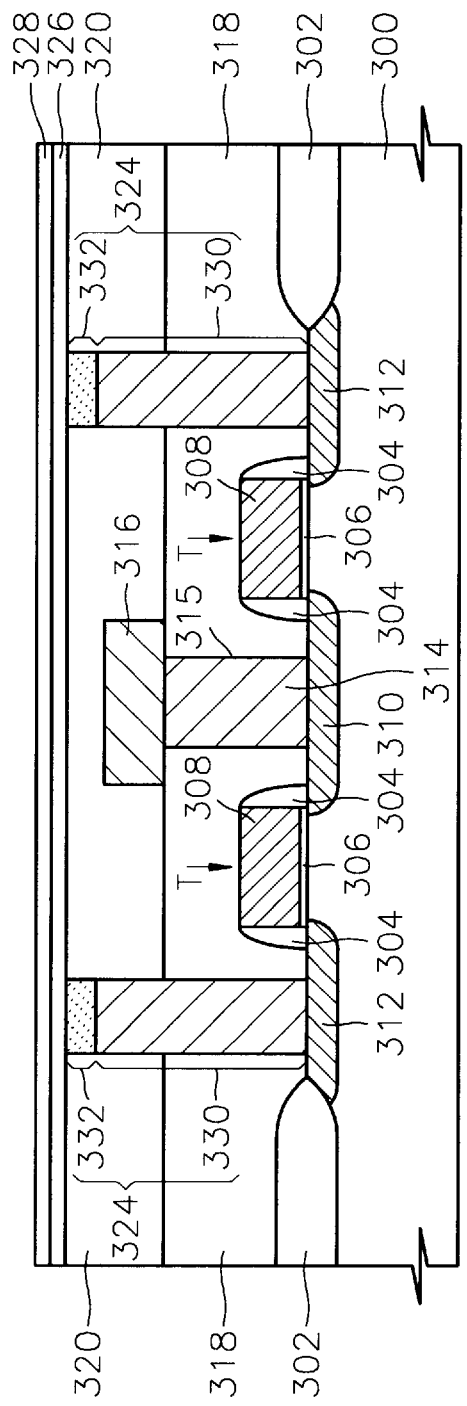

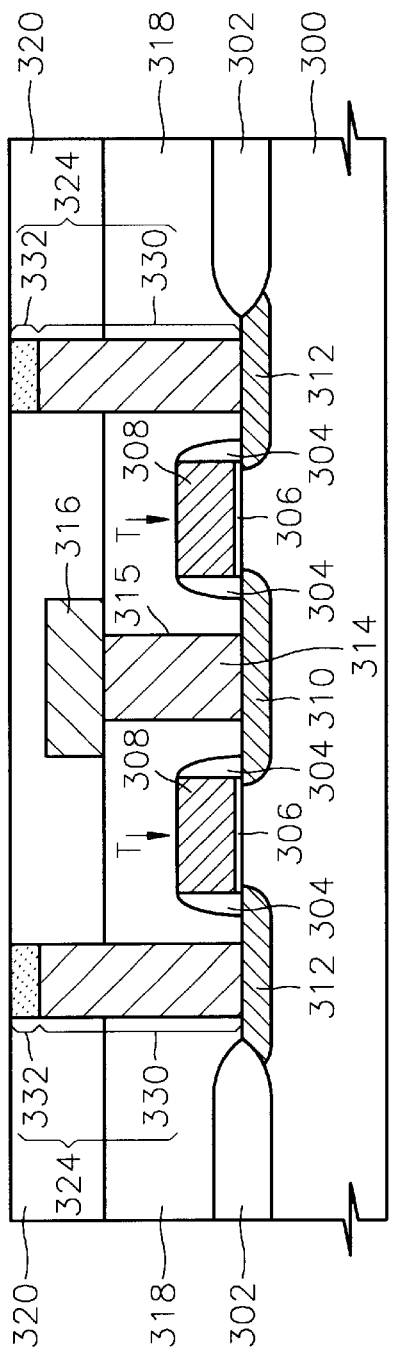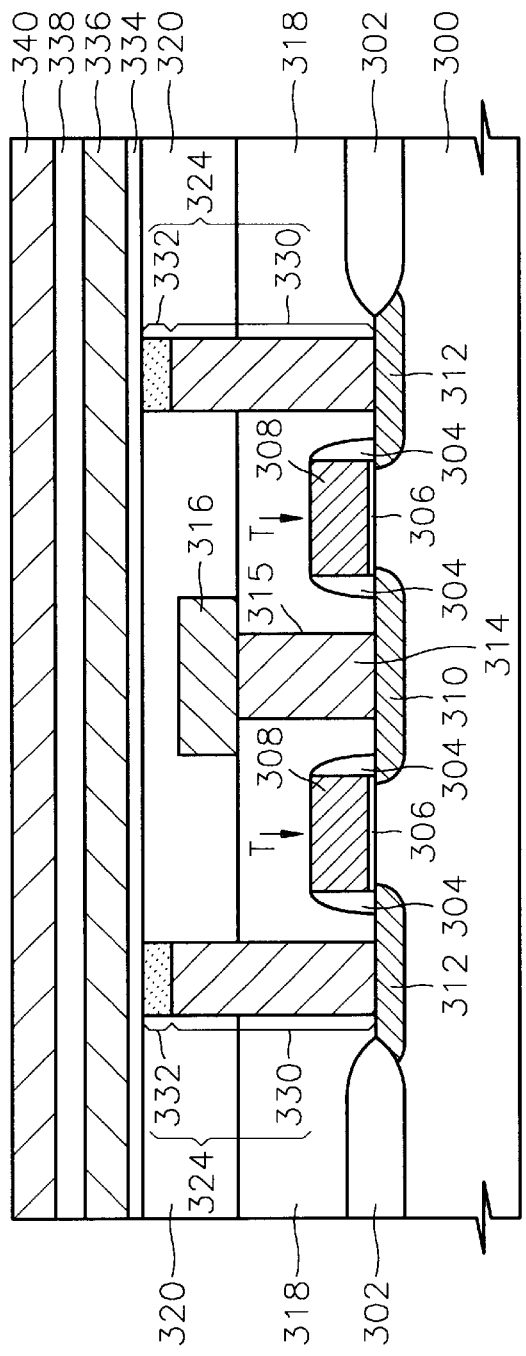

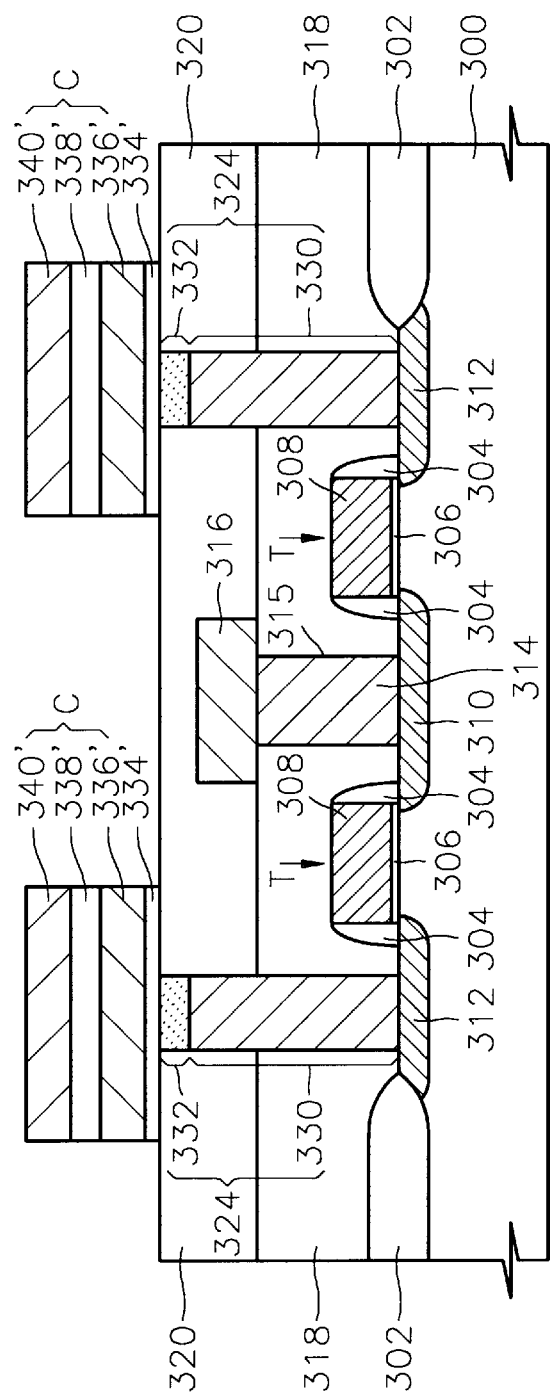
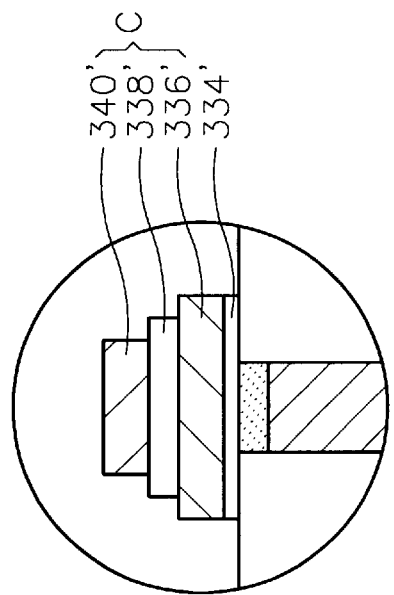
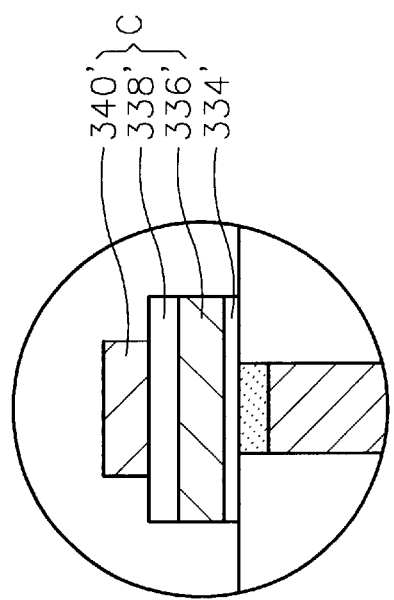

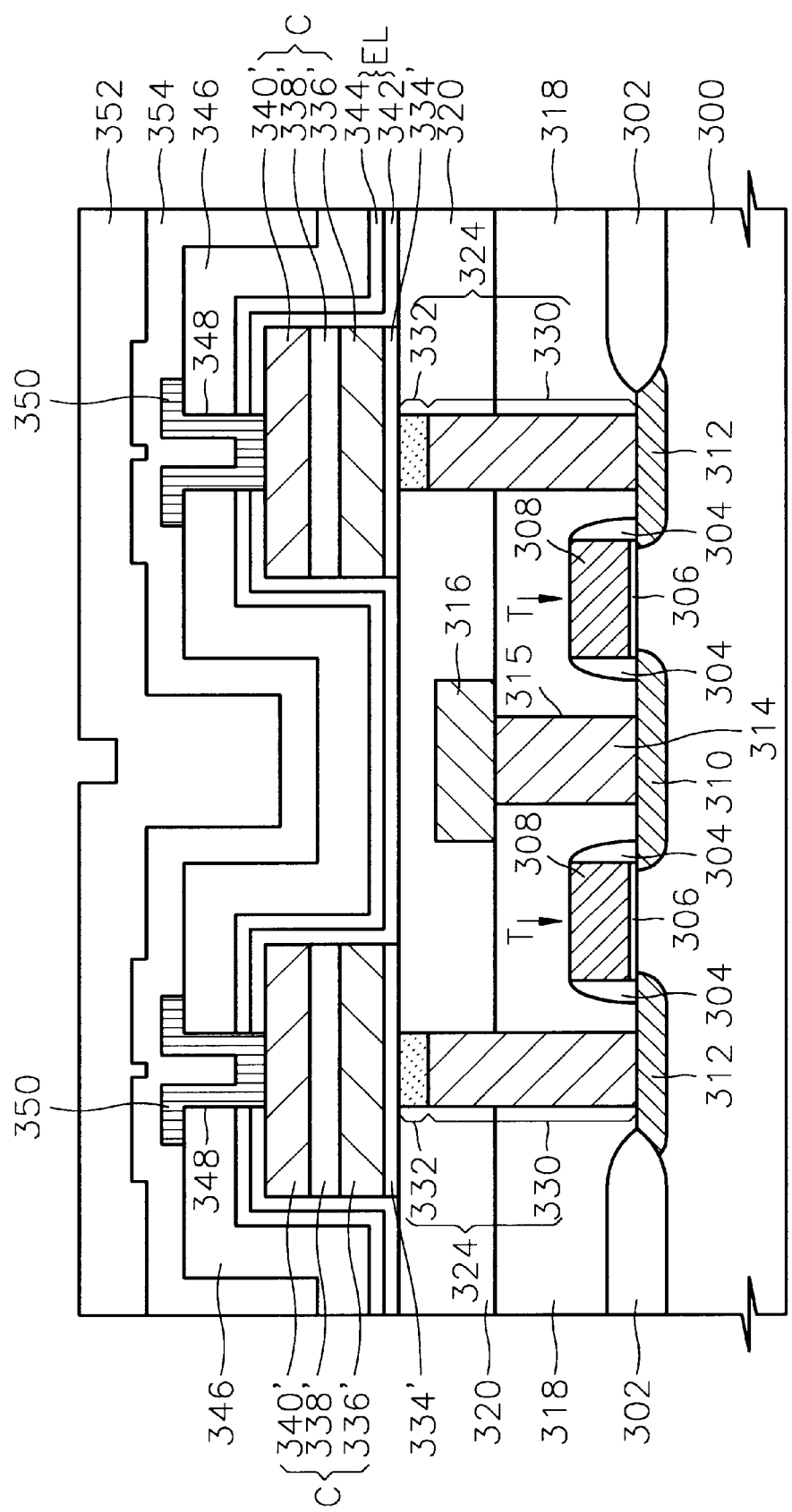

SEMICONDUCTOR MEMORY DEVICE HAVING CAPACITOR PROTECTION LAYER AND METHOD FOR MANUFACTURING THE SAME

CROSS-REFERENCE TO RELATED APPLICATION

This application is a continuation-in-part (CIP) of U.S. application Ser. No. 09/127,353, filed Jul. 31, 1998, for "Integrated Circuit Devices Having Buffer Layers Therein Which Contain Metal Oxide Stabilized by Heat Treatment Under Low Temperature," now U.S. Pat. No. 6,144,060, the disclosure of which is hereby incorporated herein by reference.

BACKGROUND OF THE INVENTION

1. Field of the Invention

The present invention relates to a semiconductor memory device and a method of manufacturing the same, and more particularly, to a semiconductor memory device having a capacitor protection layer and a method of manufacturing the same.

2. Description of the Related Art

Recently, in the field of a semiconductor memory device manufacture, great interest has been focused on a method of forming a capacitor dielectric layer with a ferroelectric material. This is because in non-volatile semiconductor devices, remnant polarization ($P_r$) of the ferroelectric material is compatible with the concept of a binary memory which forms the basis of digital memory devices which have been widely used. At present, there are two main ferroelectric materials in use: PZT ($Pb(Zr, Ti)O_3$) and SBT ($SrBi_2Ta_2O_9$).

However, in forming a capacitor dielectric layer of a semiconductor memory device with a ferroelectric material, a serious problem is the deterioration in ferroelectric characteristics of the ferroelectric material during the integration processes of a semiconductor memory device carried out after the formation of a capacitor. In more detail, the formation of a capacitor is followed by an interlayer dielectric (ILD) process, an intermetal dielectric (IMD) process, a passivation process and the like. During these processes, contaminants, particularly, hydrogen ions, are derived. The derived hydrogen ions may directly diffuse into the capacitor, or may gradually diffuse into the capacitor, after being incorporated into an ILD layer, an IMD layer or a passivation layer during the formation processes thereof. As a result, the residual polarization ($P_r$), (one of the ferroelectric characteristics of the ferroelectric material used as a capacitor dielectric layer), decreases below a critical level, so that a capacitor may malfunction.

For example, when a ferroelectric capacitor formed on a semiconductor, is exposed during the ILD process to form an ILD film of a silicon oxide layer thereon, the capacitor dielectric layer is deteriorated. That is, in the ILD process for forming an ILD layer with a silicon oxide layer using plasma enhanced chemical vapor deposition (PECVD), silane gas ($SiH_4$) and oxygen gas ($O_2$) are used as reaction gases, and hydrogen ions are derived as a byproduct. The derived hydrogen ions directly diffuse into the dielectric layer of the ferroelectric capacitor or are incorporated into an ILD film formed in the ILD process, thereby deteriorating the capacitor dielectric layer. As a result, the $P_r$ value of the capacitor dielectric layer is lowered to a critical level, causing a degradation of the ferroelectric characteristics of the capacitor dielectric layer. The deterioration of the capacitor dielectric layer in the integration procedure of a semiconductor memory device is not limited to the ILD process only, but occurs in the IMD process for forming an IMD film as well as the passivation process for forming an passivation layer.

To solve this problem, a conventional semiconductor memory device manufacturing technique has adopted a method of encapsulating a capacitor with a single insulating layer. For example, U.S. Pat. No. 5,822,175 teaches a method of encapsulating a capacitor with a silicon oxide layer, a doped silicon oxide layer or a silicon nitride layer for the purpose of preventing deterioration of a capacitor dielectric layer by diffusion of hydrogen.

Meanwhile, in the formation of a capacitor, after a capacitor dielectric layer is formed on a semiconductor substrate, it is heated to be crystallized at a temperature of 600 to 800° C. in an oxygen atmosphere, so that its insulating characteristics can be enhanced. In addition, after the capacitor is formed, a heat treatment is performed at a temperature of 450 to 600° C. in an oxygen atmosphere, so as to repair damage caused in the dry etching step performed during the formation of the capacitor, and stabilize the obtained capacitor.

However, during the heat treatment, oxygen diffuses into a contact plug which electrically connects a impurity-doped region, for example, source region and the capacitor, thereby increasing contact resistance. For example, in the case where the contact plug is formed of doped polysilicon, oxygen which diffuses into the contact plug reacts with the polysilicon, to thereby form a silicon oxide layer at the interface between the contact plug and the capacitor. As a result, a contact resistance is increased to the extent that the operating speed of a semiconductor memory device is slowed down.

SUMMARY OF THE INVENTION

To solve the above problems, it is an object of the present invention to provide a semiconductor memory device having a capacitor protection layer, which prevents deterioration of a capacitor dielectric layer by diffusion of contaminants, and a material layer for forming a low-resistance contact.

It is another object of the present invention to provide a method of manufacturing a semiconductor memory device, which ensures capacitor protection in semiconductor device integration performed after the formation of a capacitor.

To achieve the first object of the present invention, one embodiment of the semiconductor memory device according to the present invention comprises a capacitor having a lower electrode, an upper electrode and a capacitor dielectric layer interposed between the lower and upper electrodes. An encapsulating layer also is provided having a multi-layered structure. The encapsulating layer may cover the entire surface of the capacitor and comprising at least two material layers formed of different insulating materials. A dielectric layer also is formed on the encapsulating layer, and a metal contact is formed through the encapsulating layer and the dielectric layer to contact the upper electrode.

Preferably, the encapsulating layer comprises at least a blocking layer and a capacitor protection layer, the blocking layer being under the capacitor protection layer, and the blocking layer and the capacitor protection layer are formed of different material layers. If the encapsulating layer has a bilayered structure, the blocking layer may be a dielectric layer covering the entire surface of the capacitor, except for a portion of the upper electrode on which the metal contact is formed, and the capacitor protection layer may be a dielectric layer covering the entire surface of the blocking layer. Preferably, the blocking layer is formed of a material layer capable of preventing a reaction between a material layer, which is formed under the blocking layer, and the capacitor protection layer. More preferably, the blocking layer is formed of a $TiO_2$ layer, a $Ta_2O_5$ layer, a $BaTiO_3$ layer, a $SrTiO_3$ layer, a $Bi_4Ti_3O_{12}$ layer or a $PbTiO_3$ layer.

Preferably, the capacitor protection layer is formed of a material layer capable of preventing diffusion of hydrogen entrapped in the dielectric layer formed on the capacitor protection layer into the capacitor dielectric layer, and more preferably, the capacitor protection layer is formed of an $Al_2O_3$ layer, a $TiO_2$ layer, a $Ta_2O_5$ layer, a $BaTiO_3$ layer, a $SrTiO_3$ layer, a $Bi_4Ti_3O_{12}$ layer or a $PbTiO_3$ layer. Preferably, the material layer for the capacitor protection layer is different from the material layer for the blocking layer.

The semiconductor memory device may further comprise a passivation layer over the metal contact and the dielectric layer. In addition, a hydrogen barrier layer may be optionally interposed between the metal contact and the passivation layer so as to block diffusion of hydrogen (incorporated in the passivation layer 138) into the capacitor dielectric layer. Preferably, the hydrogen barrier layer is formed of an $Al_2O_3$ layer, a $TiO_2$ layer, a $Ta_2O_5$ layer, a $BaTiO_3$ layer, a $SrTiO_3$ layer, a $Bi_4Ti_3O_{12}$ layer or a $PbTiO_3$ layer.

The semiconductor memory device according to the present invention may further comprise an interlayer dielectric film under the capacitor and a conductive plug formed through the interlayer dielectric film. The conductive plug may be electrically connected to the capacitor lower electrode and an interface layer formed of a cobalt silicide layer which extends between the capacitor lower electrode and the conductive plug.

The semiconductor memory device according to the present invention may further comprise an interlayer dielectric layer under the capacitor and a conductive plug formed through the interlayer dielectric film. The conductive plug may be electrically connected to the capacitor lower electrode. The conductive plug may be formed exclusively of a cobalt silicide layer or as a bilayer of a conductive layer and a cobalt silicide layer.

Another embodiment of the semiconductor memory device according to the present invention comprises a capacitor having a lower electrode, an upper electrode and a capacitor dielectric layer interposed between the lower and upper electrodes. An encapsulating layer also may be provided to cover the entire surface of the capacitor. The encapsulating layer may have a multi-layered structure at least including a blocking layer and a capacitor protection layer formed of different insulating materials, wherein the blocking layer is formed under the capacitor protection layer.

Still another embodiment of the semiconductor memory device according to the present invention comprises a capacitor having a lower electrode, an upper electrode and a capacitor dielectric layer interposed between the lower and upper electrodes. A dielectric layer is formed over the capacitor. A metal contact is formed through the dielectric layer to contact the upper electrode and a passivation layer is formed over the metal contact. In this embodiment, a hydrogen barrier layer is interposed between the metal contact and the passivation layer.

To achieve the second object of the present invention, one embodiment of the method for manufacturing a semiconductor memory device comprises the steps of forming a capacitor having a lower electrode, an upper electrode and a capacitor dielectric layer interposed between the lower and upper electrodes. An encapsulating layer also is formed with a multi-layered structure to thereby cover the entire surface of the capacitor.

The encapsulating layer with a multi-layered structure may include a blocking layer and a capacitor protection layer which are formed of different materials. The blocking layer may be formed under the capacitor protection layer. For a bilayered encapsulating layer, a blocking layer covers the entire surface of the capacitor, and in turn a capacitor protection layer covers the blocking layer.

In the semiconductor memory device manufacturing method according to the present invention, after the formation of the blocking layer, a heat treatment process may be performed at a temperature of approximately 400 to 600° C. in an oxygen atmosphere. The blocking layer may be formed of a material capable of preventing a reaction between the underlying layer and the capacitor protection layer, and/or capable of preventing volatilization of the capacitor dielectric material. Preferably, the blocking layer may be a $TiO_2$ layer, a $Ta_2O_5$ layer, a $BaTiO_3$ layer, a $SrTiO_3$ layer, a $Bi_4Ti_3O_{12}$ layer or a $PbTiO_3$ layer.

The capacitor protection layer may be formed of a material layer that is capable of blocking diffusion of hydrogen into the capacitor dielectric layer. Preferably, the capacitor protection layer may be formed of a $TiO_2$ layer, a $Ta_2O_5$ layer, an $Al_2O_3$ layer, a $BaTiO_3$ layer, a $SrTiO_3$ layer, a $Bi_4Ti_3O_{12}$ layer a $PbTiO_3$ layer. Here, the capacitor protection layer is formed of a different material from the material used to form the blocking layer.

In the semiconductor memory device manufacturing method according to the present invention, after the formation of the encapsulating layer, the steps of forming a dielectric layer on the encapsulating layer, forming a metal contact through the dielectric layer to contact the upper electrode and forming a passivation layer over the semiconductor substrate having the metal contact, may be performed.

Prior to the formation of the passivation layer, a hydrogen barrier layer may be formed over the entire surface of the semiconductor substrate. Preferably, the hydrogen barrier layer may be formed of an $Al_2O_3$ layer, a $TiO_2$ layer, a $Ta_2O_5$ layer, a $BaTiO_3$ layer, a $SrTiO_3$ layer, a $Bi_4Ti_3O_{12}$ layer or a $PbTiO_3$ layer. Preferably, the hydrogen barrier layer is formed by an atomic layer deposition (ALD) process.

In another embodiment of the semiconductor memory device manufacturing method according to the present invention, includes forming a predetermined semiconductor integrated circuit device on a semiconductor substrate and forming a passivation layer over the semiconductor substrate having the semiconductor integrated circuit device. A hydrogen barrier layer also may be formed over the entire surface of the semiconductor substrate prior to formation of the passivation layer.

BRIEF DESCRIPTION OF THE DRAWINGS

The above objects and advantages of the present invention will become more apparent by describing in detail preferred embodiments thereof with reference to the attached drawings in which:

FIGS. 3A through 3J are sectional views illustrating a first embodiment of a method of manufacturing a semiconductor memory device according to the present invention;

DETAILED DESCRIPTION OF THE INVENTION

Figure 1A:
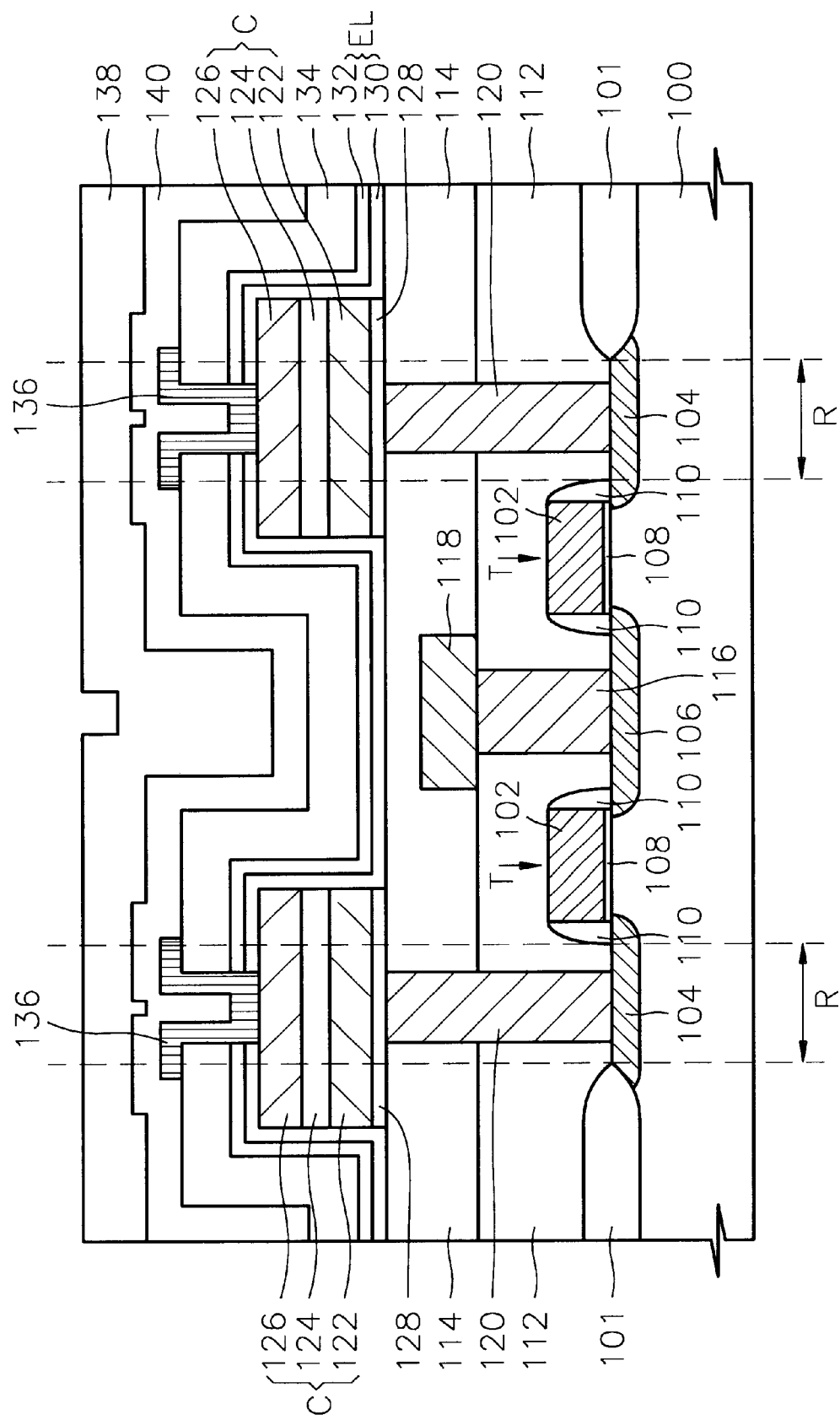
FIG. 1A is a sectional view illustrating a first embodiment of a semiconductor memory device according to the present invention.

The present invention now will be described more fully with reference to the accompanying drawings, in which preferred embodiments of the invention, which relates to a semiconductor memory device having a capacitor encapsulated with multiple layers and a method of manufacturing the same, are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In embodiments of the present invention, which is to be described with reference to FIGS. 1 through 5, the capacitor of a semiconductor memory device is formed in a capacitor on bit line (COB) structure. However, the present invention can also be applied to the case where a capacitor is formed in a capacitor under bit line (CUB) structure.

FIG. 1A is a sectional view illustrating the structure of a semiconductor memory device according to a first embodiment of the present invention. Referring to FIG. 1A, , an isolation layer 101 is formed on a semiconductor substrate 100 by a local oxidation of silicon (LOCOS) process to define an active region, and a field effect transistor (FET) T is formed on the active region. The isolation layer 101 defining the active region can be formed by a trench isolation technique. The FET T includes a gate electrode 102, a source region 104 and a drain region 106. A gate oxide layer 108 formed of an oxide layer is interposed between the gate electrode 102 and the semiconductor substrate 100. Also, a sidewall spacer 110 is formed of a nitride layer on the sidewalls of the gate electrode 102.

The entire surface of the semiconductor substrate 100 having the isolation layer 101 and the FET T are covered with a first interlayer dielectric (ILD) film 112, and a second ILD film 114 is deposited again on the first ILD film 112.

The first and second ILD films 112 and 114 may be a borosilicate glass (BSG) layer, a phosphosilicate glass (PSG) layer, a borophosphosilicate glass (BPSG) layer, a tetraethylothosilicate glass (TEOS), an undoped silicate glass (USG) layer, an ozone ($O_3$)-TEOS layer, a plasma enhanced (PE)-TEOS layer, or a composite layer of these layers. Also, a landing plug 116 is formed in the first ILD film 112 and a bit line contact pad 118 is formed in the second ILD film 114. Further, a conductive plug 120 is formed through the first and second ILD films 112 and 114. Although not shown, the bit line contact pad 118 is electrically connected to a bit line (not shown), and the landing plug 116 electrically connects an impurity-doped region in the semiconductor substrate 100, for example, the drain region 106 and the bit line contact pad 118. The conductive plug 120 connects a capacitor C formed on the second ILD film 114, and an impurity-doped region in the semiconductor substrate 100, for example, the source region 104. The capacitor C of the semiconductor memory device includes a lower electrode 122, a capacitor dielectric layer 124 and an upper electrode 126, and an interface layer 128 is interposed between the capacitor C and the second ILD film 114.

In FIG. 1A, the conductive plug 120, the interface layer 128 and the capacitor C are schematically illustrated because the specific structures of the conductive plug 120, the interface layer 128 and the capacitor C, respectively, can be varied in the semiconductor memory device according to the present invention. The various structures of the conductive plug 120, the interface layer 128 and the capacitor C will be described with reference to FIGS. 2A and 2E later.

An encapsulating layer EL for protecting the capacitor C, which has a multi-layered structure, is formed on the entire surface (except for part of the surface of the upper electrode 126), of the capacitor C and the surface of the second ILD film 114. Also, a third ILD film 134 is formed on the encapsulating layer EL, and an upper electrode metal contact 136 is formed on the part of the surface of the upper electrode 126 which is not covered with the encapsulating layer EL. The third ILD film 134 may be a BSG layer, a PSG layer, a BPSG layer, a TEOS layer, a USG layer, a $O_3$-TEOS layer, a PE-TEOS layer or a composite layer of these layers.

It is desirable that the multi-layered encapsulating layer EL performs the following functions, in connection with the protection of the capacitor C. First, the encapsulating layer EL must be able to prevent volatilization of the capacitor dielectric layer 124. For example, when the capacitor dielectric layer 124 is formed of a ferroelectric layer, such as PZT, BST or PLZT layer, it is important to prevent outgassing of oxygen atoms from the capacitor dielectric layer 124. This is because the volatilization of the capacitor dielectric layer 124 may deteriorate the characteristics of the capacitor C, so that its inherent function of storing information by accumulating charges, may be degraded. Second, the encapsulating layer EL should be able to block diffusion of hydrogen incorporated in a material layer formed in the vicinity of the capacitor C, for example, in the third ILD film 134, into the capacitor dielectric layer 124.

Preferably, the encapsulating layer EL includes at least a blocking layer and a capacitor protection layer which are formed of different insulating materials. The capacitor protection layer acts to prevent the diffusion of hydrogen into the capacitor dielectric layer 124. The blocking layer, which is formed below the capacitor protection layer, prevents a reaction between the capacitor protection layer and the underlying material layer thereof, and/or prevents the volatilization of the capacitor dielectric layer. The main function of the blocking layer and the capacitor protection layer is different, but the blocking layer and the capacitor protection layer may cooperatively perform these protective functions.

As for the multi-layered structure of the encapsulating layer EL, the encapsulating layer EL may have the following structures. For example, for a triple-layer encapsulating layer EL, it may have the structure where a blocking layer, a buffering layer and a capacitor protection layer are sequentially stacked. Alternatively, for a bilayer encapsulating layer EL, it may have the structure where a blocking layer and a capacitor protection layer are sequentially stacked. It is appreciated that the structure of the encapsulating layer EL is not limited to the bilayered and triple-layered structures, and that the number of material layers constituting the encapsulating layer EL and the structure thereof may be varied.

In FIG. 1A, which shows the structure of a semiconductor memory device according to a first embodiment of the present invention, the encapsulating layer has a bilayered structure. The blocking layer 130 directly covers the surface of the capacitor C (except for part of the surface of the upper electrode 126), and the surface of the second ILD layer 114. Also, the capacitor protection layer 132 is directly formed on the blocking layer 130.

A material layer for the blocking layer 130 is selected in view of the function of the blocking layer 130. Preferably, the blocking layer 130 may be a $TiO_2$ layer, a $Ta_2O_5$ layer, a $BaTiO_3$ layer, a $SrTiO_3$ layer, a $Bi_4Ti_3O_{12}$ layer or a $PbTiO_3$ layer. In the selection of a material layer for the blocking layer 130, it is preferable that a material layer which does not react with the capacitor dielectric layer 124, is selected. Thus, preferably, the type of material layer for the blocking layer 130 is determined depending on the type of material layer selected to form the capacitor dielectric layer 124. For example, if the capacitor dielectric layer 124 is formed of a ferroelectric layer, such as PZT, BST or PLZT layer, the blocking layer 130 may be formed of a sputtering-$TiO_2$ layer, which refers to a $TiO_2$ layer formed by a sputtering process. However, in case that $TiO_2$ is selected as a material for the blocking layer 130, the blocking layer 130 may be formed using a variety of processes including chemical vapor deposition (CVD), low-pressure chemical vapor deposition (LPCVD), subatmospheric chemical vapor deposition (SACVD), plasma enhanced chemical vapor deposition (PECVD), atomic layer deposition (ALD) and laser ablation (LA). In the case of using materials other than $TiO_2$ as the blocking layer 130, the above-mentioned techniques can be adopted. The thickness of the blocking layer 130 is determined in view of the required function thereof and what is the physical and chemical properties of the material selected as the blocking layer 130. Preferably, the blocking layer 130 has a thickness of approximately 50 to 150 Å. Also, the blocking layer 130 may be a material layer stabilized for the required function of the blocking layer 130 by a heat treatment in an oxygen atmosphere at a temperature of 400 to 600° C.

A material for the capacitor protection layer 132 is determined in view of the function of the capacitor protection layer 132. Preferably, the capacitor protection layer 132 may be a $TiO_2$ layer, a $Ta_2O_5$ layer, an $Al_2O_3$ layer, a $BaTiO_3$ layer, a $SrTiO_3$ layer, a $Bi_4Ti_3O_{12}$ layer or a $PbTiO_3$ layer. Here, the type of material layer for the capacitor protection layer 132 can be varied depending on the type of material layers selected as the capacitor dielectric layer 124 and the blocking layer 130. For example, a material layer which is liable to react with the blocking layer 130 is improper for the capacitor protection layer 132. Also, it is preferable that the capacitor protection layer 132 is formed of a material layer different from the blocking layer 130. For example, when the capacitor dielectric layer 124 is formed of a ferroelectric layer, such as PZT, BST or PLZT layer, and the blocking layer 130 is formed of a sputtering-$TiO_2$ layer, it is preferable that the capacitor protection layer 132 is formed of an ALD-$Al_2O_3$ layer, which refers to an $Al_2O_3$ layer formed by the ALD process. However, in case that $Al_2O_3$ is selected as a material for the capacitor protection layer 132, the capacitor protection layer 132 may be formed using a variety of processes including chemical vapor deposition (CVD), low-pressure chemical vapor deposition (LPCVD), subatmospheric chemical vapor deposition (SACVD), plasma enhanced chemical vapor deposition (PECVD), atomic layer deposition (ALD) and laser ablation (LA). In the case of using material other than $Al_2O_3$, the above-mentioned techniques may be applied for the capacitor protection layer 132. The capacitor protection layer 132 may be a material layer stabilized for the required function of the capacitor protection layer 132 by a heat treatment in an oxygen atmosphere at a temperature of approximately 400 to 600° C. The thickness of the capacitor protection layer 132 is determined in view of the required function of thereof and what are the physical and chemical properties of the material selected to form the same. Preferably, the capacitor protection layer 132 has a thickness of approximately 50 to 5000 Å, but more preferably a thickness of approximately 50 to 1500 Å.

A passivation layer 138 is formed over the upper electrode metal contact 136 and the third ILD film 134. The passivation layer 138 may be a silicon oxide layer, a silicon nitride layer or a silicon oxynitride layer. The passivation layer 138 may have a thickness of approximately 2000 to 20000 Å.

In order to prevent the diffusion of hydrogen into the capacitor C of the semiconductor memory device, a hydrogen barrier layer 140 may be alternatively formed between the third ILD film 134 and the passivation layer 138. The hydrogen barrier layer 140 performs substantially the same function as the capacitor protection layer 132. In other words, the hydrogen barrier layer 140 blocks the diffusion of hydrogen incorporated in the passivation layer 138 through the upper electrode metal contact 136 into the capacitor, and thus protects the capacitor dielectric layer 124 from hydrogen attack. Preferably, the hydrogen barrier layer 140 may be a $Al_2O_3$ layer, a $TiO_2$ layer, a $Ta_2O_5$ layer, a $BaTiO_3$ layer, a $SrTiO_3$ layer, a $Bi_4Ti_3O_{12}$ layer or a composite layer of these layers. More preferably, the ALD-$Al_2O_3$ layer is preferred as the hydrogen barrier layer 140 because it is denser than other layers due to its stable crystalline structure, and has a 100% step coverage. In the case of selecting $Al_2O_3$ as a material to form the hydrogen barrier layer 140, the hydrogen barrier layer 140 may be a CVD-$Al_2O_3$ layer, a LPCVD-$Al_2O_3$ layer, a SACVD-$Al_2O_3$ layer, a PECVD-$Al_2O_3$ layer, a sputtering-$A_2O_3$ layer or a LA-$Al_2O_3$ layer. Preferably, the hydrogen barrier layer 140 has a thickness of approximately 50 to 2000 Å, but more preferably a thickness of approximately 200 to 300 Å.

In a certain case, the hydrogen barrier layer 140 may be a material layer stabilized by heat treatment in an oxygen atmosphere at a temperature of 400 to 600° C. The use of a stabilized material layer as the hydrogen barrier layer 140 can enhance the hydrogen diffusion blocking function thereof.

Although not shown, a buffering layer may be interposed between the hydrogen barrier layer 140 and the third ILD layer 134. For example, the buffering layer may be an oxide layer formed by an APCVD process (atmospheric pressure CVD) or an oxide layer formed by a PECVD process. In the case that the buffering layer is an oxide layer formed by the APCVD process, it may be an $O_3$-TEOS layer, a PSG layer or a BPSG layer. Also, in the case that the buffering layer is an oxide layer formed by the PECVD process it may be a PE-TEOS layer or a PE-SiH$_4$ layer. Preferably, the buffering layer has a thickness of approximately 50 to 1000 Å.

Figure 1B:
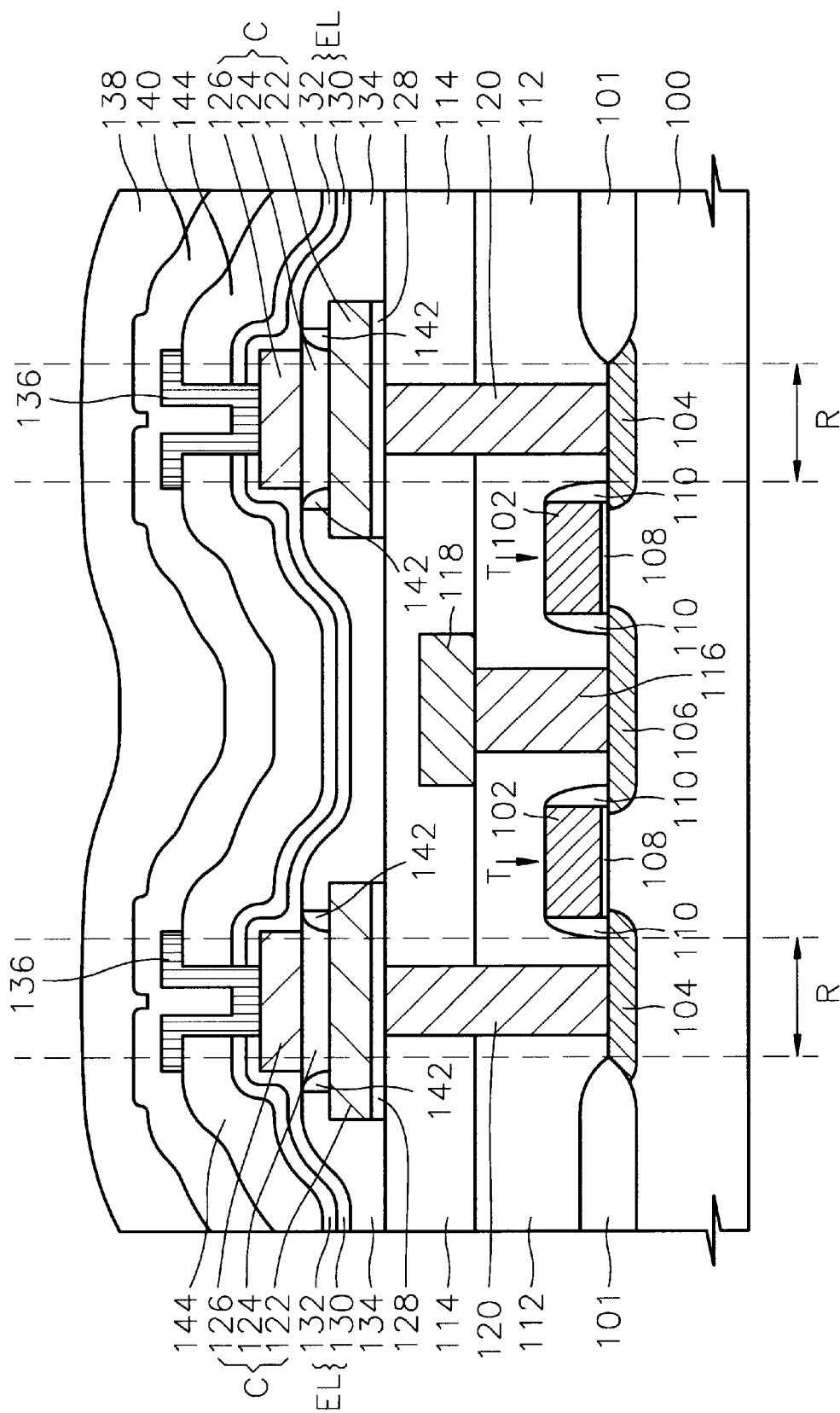
FIG. 1B is a sectional view illustrating a second embodiment of the semiconductor memory device according to the present invention.

FIG. 1B illustrates the structure of the semiconductor memory device according to a second embodiment of the present invention. The isolation layer 101 formed in the semiconductor substrate 100, the FET T, the first ILD film 112, the second ILD film 114, the landing plug 116 in the first ILD film 112, the bit line contact pad 118 in the second ILD film 114, the conductive plug 120 formed through the first and second ILD films 112 and 114 have substantially the same structure as those in FIG. 1A.

Referring to FIG. B, the conductive plug 120 and the capacitor C of the semiconductor memory device are electrically connected while the interface 128 is interposed therebetween. The capacitor C is comprised of the lower electrode 122, the capacitor dielectric layer 124 and the upper electrode 126. The lower electrode 122 and the capacitor dielectric layer 124 of the capacitor C are in a third ILD film 134, and diffusion barrier spacers 142 are interposed between the sidewalls of the capacitor dielectric layers 124 and the third ILD film 134.

The conductive plug 120, the interface layer 128 and the capacitor C of the second embodiment of the semiconductor memory device according to the present invention, may be implemented with various structures, as in the first embodiment of the semiconductor memory device in FIG. 1A. These structures will be described with reference to FIGS. 2A through 2E later.

The diffusion barrier spacer 142 is, preferably, formed of a material layer which is able to prevent diffusion of hydrogen incorporated in the third IDL film 134 into the capacitor dielectric layer 124. Preferably, the diffusion barrier spacer 142 may be an $Al_2O_3$ layer, a $TiO_2$ layer, a $Ta_2O_5$ layer, a $BaTiO_3$ layer, a $SrTiO_3$ layer, a $Bi_4Ti_3O_{12}$ layer, a $PbTiO_3$ layer or a composite layer of these layers, but more preferably, the diffusion barrier layer 142 is an ALD-$Al_2O_3$ layer. When material layers other than the $Al_2O_3$ layer are formed as the diffusion barrier spacer 142, the ALD technique is preferred.

The encapsulating layer EL, which has a multi-layered structure, covers the surface of the third ILD film 134, part of the surface of the capacitor dielectric layer 124 and part of the surface and sidewalls of the upper electrode 126 of the capacitor C.

As in the first embodiment of the present invention, the encapsulating layer EL of the second embodiment of the semiconductor memory device also has a bilayered structure including the blocking layer 130 and the capacitor protection layer 132. A fourth ILD film 144 is formed on the encapsulating layer EL, and the upper electrode metal contact 136 is formed through the fourth ILD film 144 and the encapsulating layer EL. Also, the passivation layer 138 is formed over the fourth ILD film 144 and the upper electrode metal contact 136. The third ILD film 134 and the fourth ILD film 144 may be formed of substantially the same material layer as the first ILD film 112. The type of material layer for the passivation layer 138 has been described in the first embodiment of the semiconductor memory device according to the present invention, and thus a description thereof will not be repeated.

As in the first embodiment of the semiconductor memory device according to the present invention, the hydrogen barrier layer 140 may be alternatively interposed between the fourth ILD film 144 and the passivation layer 138 for more effective protection of the capacitor C from diffusion of hydrogen. The type of material layer for the hydrogen barrier layer 140 and the thickness thereof have been described in the first embodiment of the semiconductor memory device according to the present invention, and thus a description thereof will not be repeated.

As in the first embodiment of the semiconductor memory device, a buffering layer (not shown) may be alternatively formed between the diffusion barrier layer 140 and the fourth ILD film 144. The type of material layer for the buffering layer and the thickness thereof have been described in the first embodiment of the semiconductor memory device according to the present invention, and thus a description thereof will not be repeated.

As mentioned above, the conductive plug 120, the interface layer 128 and the capacitor C are schematically illustrated in FIGS. 1A and 1B. Thus, preferred embodiments with respect to the structure of the conductive plug 120, the interface layer 128 and the capacitor C will be described in greater detail with reference to FIGS. 2A through 2E in the below. The structures of the conductive plug 120, the, interface layer 128 and the capacitor C illustrated in FIGS. 2A through 2E are limited to the region indicated by R in FIGS. 1A and 1B, and thus the side profile of the capacitor C is excluded from consideration. The following various structures of the conductive plug 120, the interface layer 128 and the capacitors can be respectively adopted by the semiconductor memory devices shown in FIGS. 1A and 1B.

Figure 2A:
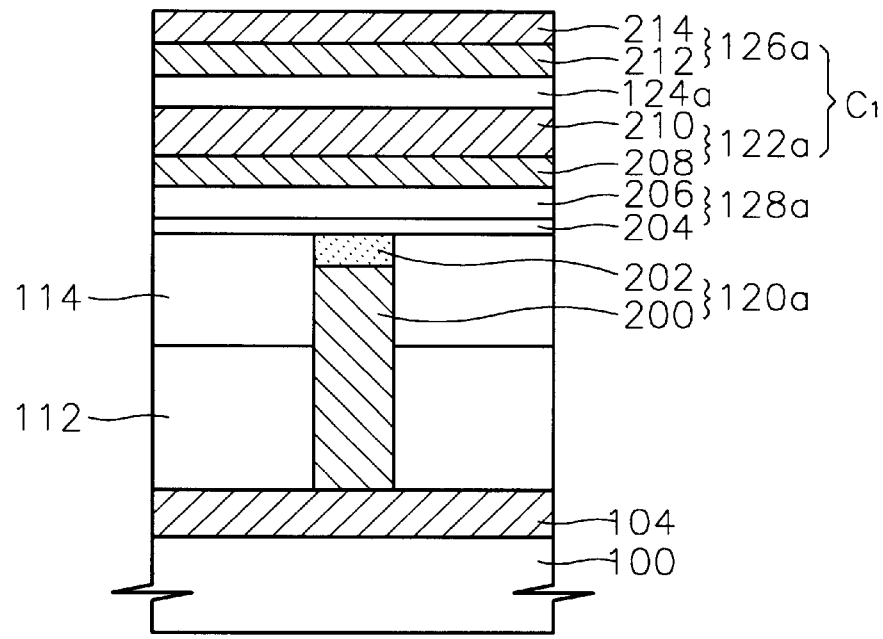
FIGS. 2A through 2E are sectional views partly illustrating five exemplary structures, each of which has a conductive plug, an interface layer and a capacitor, and can be included as a part in the semiconductor memory device according to the present invention.

FIG. 2A illustrates a first embodiment of the conductive plug 120, the interface layer 128 and the capacitor C to be included in the semiconductor memory devices according to the present invention. Referring to FIG. 2A, a conductive plug 120a, which contact the impurity-doped region, for example, the source region 104 of the semiconductor substrate 100, is formed through the second and first ILD films 114 and 112 on the semiconductor substrate 100. The conductive plug 120a is comprised of a lower plug 200 and an upper plug 202. Preferably, the lower plug 200 is formed of a conductive material with a low resistance, and the upper plug 202 is formed of a conductive material which is resistant to oxidation and has a thermally stable sheet resistance. Preferably, the lower plug 200 may be a doped polysilicon layer, and the upper plug 202 is a cobalt silicide layer. The lower plug 200 may be formed of a doped polysilicon layer, a tungsten (W) layer, a tantalum (Ta) layer, a ruthenium (Ru) layer, an iridium (Ir) layer, a platinum (Pt) layer, an osmium (Os) layer, a tungsten silicide layer, a tungsten nitride layer, or a composite layer of these layers. The upper plug 202 may be formed of a nickel silicide layer, a titanium silicide layer, a tantalum silicide layer, a chromium silicide layer or a hafnium (Hf) silicide layer. The upper plug 202 may have a thickness of approximately 50 to 1000 Å, but more preferably, a thickness of approximately 300 to 500 Å.

An interface layer 128a in which an adhesion layer 204 and a diffusion barrier layer 206 are sequentially stacked, is formed on the second ILD film 114. Also, a capacitor lower electrode 122a, in which a metal oxide layer 208 and a heat resistant metal layer 210 are sequentially stacked, is formed on the interface layer 128a. Also, a capacitor dielectric layer 124a and a capacitor upper electrode 126a are sequentially formed on the capacitor lower electrode 122a. Preferably, the adhesion layer 204 may be formed of a material layer which is able to improve an adhesion between the diffusion barrier layer 206 and its underlying layer, i.e., the second ILD film 114. Thus, it is preferable that the adhesion layer 204 is formed of a transition metal layer. The diffusion barrier layer 206 may be formed of a material layer capable of minimizing a reaction between the metal oxide layer 208 and the material layer formed on the metal oxide layer 208, and the conductive plug 120a. Thus, it is preferable that the diffusion barrier layer 206 is formed of a transition metal nitride layer or a noble metal layer. For example, a Ti layer is preferred as the adhesion layer 204, and the thickness of the adhesion layer 204 may be in the range of 20 to 150 Å, but more preferably, 50 Å. Also, the transition metal nitride layer for the diffusion barrier layer 206 may be formed of a TiN layer, and the noble metal layer for the same may be an Ir layer and a Ru layer. Preferably, the diffusion barrier layer 206 has a thickness of approximately 500 to 1500 Å, but more preferably, a thickness of approximately 1000 Å. Although in the present embodiment a Ti layer, and TiN layer, an Ir layer and a Ru layer are introduced respectively as a material layer for the adhesion layer 204 and the diffusion barrier layer 206, it will be appreciated by one skilled in the art that the material layers for the adhesion layer 204 and the diffusion barrier layer 206 are not limited to the abovementioned material layers and any suitable material layer can be adopted for the adhesion layer 204 and the diffusion barrier layer 206.

The metal oxide layer 208, preferably, is formed of a material layer capable of supplying oxygen to the capacitor dielectric layer 124a on the lower electrode 122a when oxygen in the capacitor dielectric layer 124a is outgassed, to thereby prevent deterioration of dielectric property of the capacitor dielectric layer. More preferably, the metal oxide layer 208 is formed of an $IrO_2$ layer. The metal oxide layer 208 may be formed of an $IrO_2$ layer, a $RuO_2$ layer, a $LaSrCoO_3$ layer, a $(Ca,Sr)RuO_3$ layer or a composite layer of these layers. The thickness of the metal oxide layer 208 is varied depending on the material layer forming the same. However, it is preferable that the metal oxide layer 208 has a thickness of approximately 200 to 800 Å. For example, if the $IrO_2$ layer is selected as the material layer for the metal oxide layer 208, the metal oxide layer 208 may be formed to have a thickness of approximately 500 Å.

The heat resistant metal layer 210, preferably, is formed of a material layer having a good interfacial property with respect to the capacitor dielectric layer 124a. The heat resistant metal layer 210 may be formed of a Pt layer. Preferably, the heat resistant metal layer 210 may be formed of a Pt layer, an Ir layer, a Ru layer, a Rh layer, an Os layer, a protactinium (Pa) layer, or a composite layer of these layer. The thickness of the heat resistant metal layer 210 is varied depending to the material layer for forming the same. However, it is preferable that the heat resistant metal layer 210 has a thickness of approximately 1000 to 2000 Å. For example, if the Pt layer is selected as the material layer for the heat resistant metal layer 210, the heat resistant metal layer 210 may be formed to have a thickness of approximately about 1500 Å.

For a high capacitance of the capacitor $C_1$, the capacitor dielectric layer 124a may be formed of a $TiO_2$ layer, a $SiO_2$ layer, a $Ta_2O_5$ layer, an $Al_2O_3$ layer, an $SiO_2/SiN$ layer, a $BaTiO_3$ layer, an $SrTiO_3$ layer, a $(Ba,Sr)TiO_3$ layer, a $Bi_4Ti_3O_2$ layer, a $PbTiO_3$ layer, a $PZT(Pb,La)(Zr,TiO_3)$ layer, an $(SrBi_2Ta_2O_9)(SBT)$ layer, or a composite layer of these layers.

The capacitor upper electrode 126a may be a heat resistant metal layer, a metal oxide layer or a composite layer of these layers. Preferably, the capacitor upper electrode 126a is formed to have a bilayered structure in which the metal oxide layer 212 and the heat resistant metal layer 214 are sequentially stacked. It is preferable that the metal oxide layer 212 is an $IrO_2$ layer and the heat resistant metal layer 214 is an Ir layer. The metal oxide layer 212 may be an $IrO_2$ layer, a $RuO_2$ layer, an $IrO_2$ layer, a $(Ca,Sr)RuO_3$ layer, a $LaSrCoO_3$ layer or a composite layer of these layers. The heat resistant metal layer 214 may be a Pt layer, an Ir layer, a Ru layer, a Rh layer, an Os layer, a Pd layer or a composite layer of these layers. In the case where the capacitor upper electrode 126a has a bilayered structure including the $IrO_2$ layer and the Ir layer, preferably, the $IrO_2$ layer is formed to have a thickness of approximately 100 to 1000 Å and the Ir layer is formed to have a thickness of approximately 400 to 2000 Å.

As mentioned above, in case that the upper plug 202 of the conductive plug 120a is formed of a material layer which has a thermally stable sheet resistance, such as a cobalt silicide layer, contact resistance between the capacitor C, and the conductive plug 120a can be reduced, thereby improving the operating speed of the semiconductor memory device.

Figure 2B:
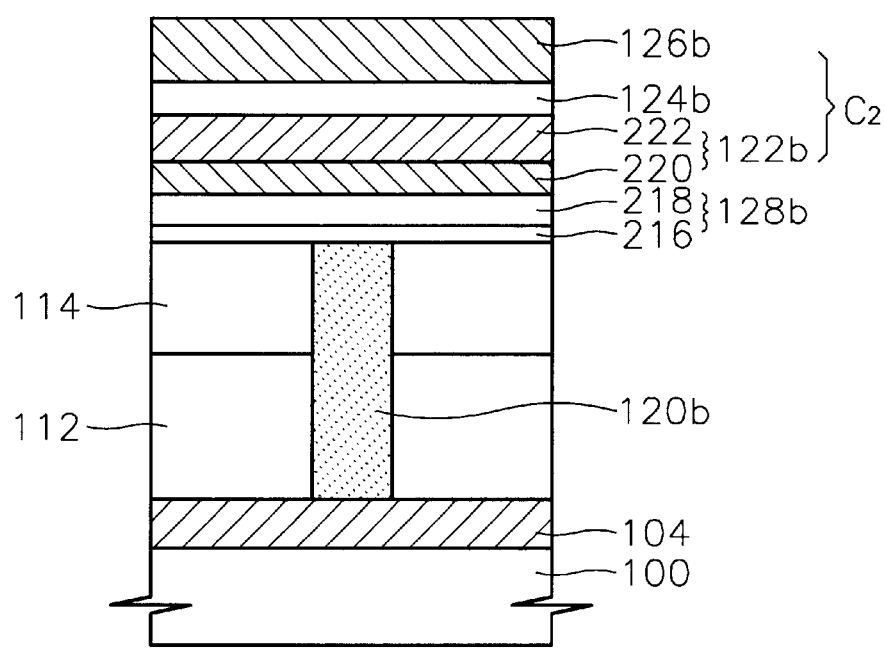

FIG. 2B illustrates a second embodiment of the conductive plug 120, the interface layer 128 and the capacitor C, which can be comprised in the semiconductor memory devices according to the present invention. Referring to FIG. 2B, a conductive plug 120b, which contacts the impurity-doped region, for example, the source region 104, is formed through the second and first ILD films 114 and 112 on the semiconductor substrate 100. In contrast to the contact plug 120a shown in FIG. 2A, the conductive plug 120b of FIG. 2B is formed of a single material layer. Preferably, the conductive plug 120b is formed of a conductive material which is resistant to oxidation and has a thermally stable sheet resistance. For example, the conductive plug 120b may be formed of a cobalt silicide layer. A variety of material layers may be used as the conductive plug 120b, including, for example, a nickel silicide layer, a titanium silicide layer, a tantalum silicide layer, a hafnium silicide layer and a chromium silicide layer.

An interface layer 128b, in which an adhesion layer 216 and a diffusion barrier layer 218 are sequentially stacked, is formed on the conductive plug 120b. Also, a capacitor lower electrode 122b, in which a metal oxide layer 220 and a heat resistant metal layer 222 are sequentially stacked, is formed on the interface layer 128b. Further, a capacitor dielectric layer 124b and a capacitor upper electrode 126b are sequentially formed on the capacitor lower electrode 122b. The type of material layer for the adhesion layer 216, the diffusion barrier layer 218, the metal oxide layer 220, the heat resistant metal layer 222, the capacitor dielectric layer 124b and the capacitor upper electrode 126b, and the structure and thickness of these layers are substantially the same as in the structure shown in FIG. 2A.

When the conductive plug 120b is formed of a material layer which has a thermally stable sheet resistance, such as a cobalt silicide layer, contact resistance between the capacitor $C_2$ and the conductive plug 120b can be reduced, thereby improving the operating speed of the semiconductor memory device.

Figure 2C:
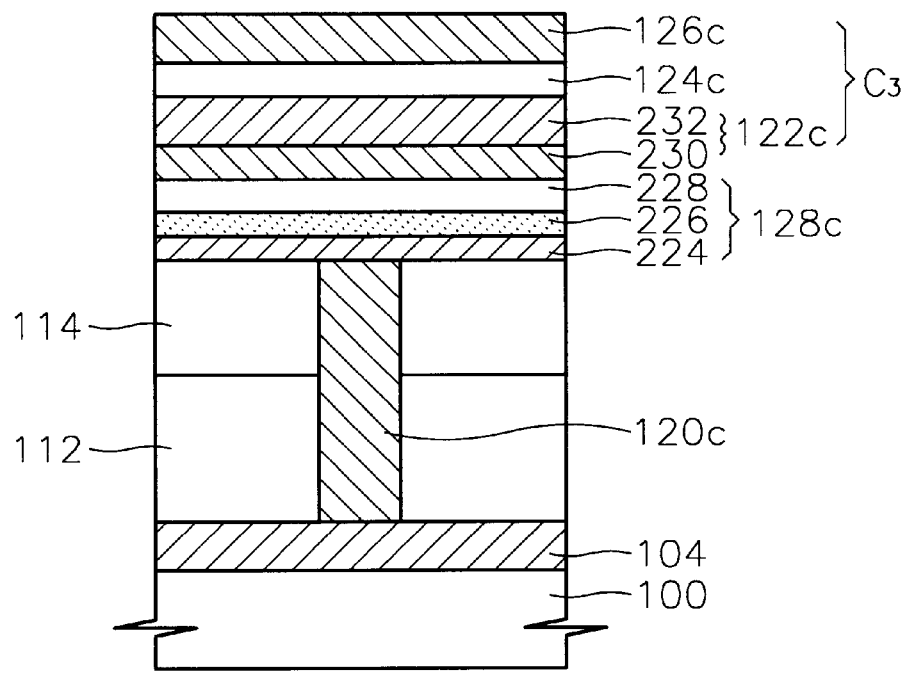

FIG. 2C illustrates a third embodiment of the conductive plug 120, the interface surface 128 and the capacitor C, which can be comprised in the semiconductor memory devices according to the present invention. Referring to FIG. 2C, a conductive plug 120c having a single-layered structure is formed through the second and first ILD films 114 and 112 on the semiconductor substrate 100. The conductive plug 120c contacts the impurity-doped region, for example, the source region 104 of the semiconductor substrate 100. The conductive plug 120c may be formed of substantially the same material as that of the lower plug 200 in FIG. 2A. For example, the conductive plug 120c may be formed of doped polysilicon. An interface layer, in which a conductive layer 224, a silicide layer 226 and a diffusion barrier layer 228 are sequentially stacked, is formed on the conductive plug 120c and the second ILD film 114. The conductive layer 224 may be substantially the same as the material layer for the lower plug 200 of FIG. 2A. For example, the conductive layer 224 may be formed of doped polysilicon. Preferably, the conductive layer 224 has a thickness of approximately 3000 to 10000 Å. Also, it is preferable the silicide layer 226 is a cobalt silicide layer and has a thickness of approximately 300 to 500 Å. The diffusion barrier layer 228 may be formed of substantially the same material as that of the diffusion barrier layer 206 in FIG. 2A. For example, the diffusion barrier layer 228 may be an Ir layer and may have a thickness of approximately 300 to 1500 Å.

Also, a capacitor lower electrode 122c, in which a metal oxide layer 230 and a heat resistant metal layer 232 are sequentially stacked, is formed on the interface layer 128c. A capacitor dielectric layer 124c and a capacitor upper electrode 126c are sequentially formed on the capacitor lower electrode 122c. The type of material layer for the metal oxide layer 230, the heat resistant metal layer 232, the capacitor dielectric layer 124c and the capacitor upper electrode 126c, and the structure and thickness of these layers are substantially the same as in the structure shown in FIG. 2A.

As mentioned above, in case that the silicide layer 226 such as a cobalt suicide layer to be resistant to heat and have a thermally stable sheet resistance, is included in the interface layer 128c, contact resistance between the conductive plug 210c and the capacitor $C_3$ can be reduced, thereby improving the operating speed of the semiconductor memory device.

Figure 2D:
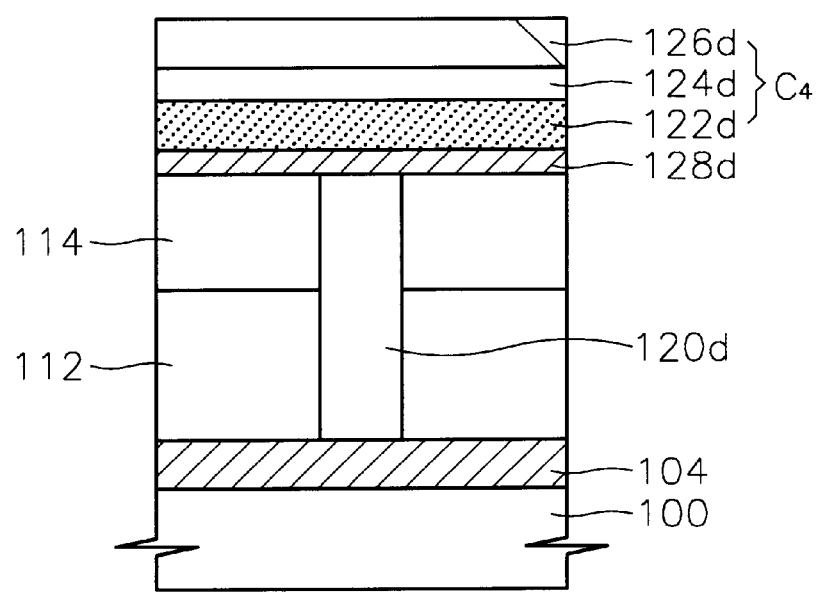

FIG. 2D illustrates a fourth embodiment of the conductive plug 120, the interface layer 128, the capacitor C, which can be comprised in the semiconductor memory devices according to the present invention. Referring to FIG. 2D, a conductive plug 120d having a single-layered structure is formed through the second and first ILD films 114 and 112 on the semiconductor substrate 100. The conductive plug 120d contacts the impurity doped region, for example, the source region 104 of the semiconductor substrate 100. Also, an interface layer 128d, which is a conductive layer, is formed on the conductive plug 120d and the second ILD film 114. The conductive plug 120d and the interface layer 128d may be formed of substantially the same material as that of the lower plug 200 in FIG. 2A. For example, the conductive plug 120d and the interface layer 128d may be formed of doped polysilicon. Preferably, the interface layer 128d may be formed of a conductive layer to have a thickness of approximately 3000 to 10000 Å. A capacitor lower electrode 122d is formed on the interface layer 128d with a conductive material layer which is resistant to heat and has a thermally stable sheet resistance. A capacitor dielectric layer 124d and a capacitor upper electrode 126d are sequentially stacked on the capacitor lower electrode 122d. The capacitor lower electrode 122d may be formed of substantially the same material as that of the upper plug 202 in FIG. 2A. For example, the capacitor lower electrode 122d may be a cobalt silicide layer and have a thickness of approximately 500 to 3000 Å. The type of material layer used for the capacitor dielectric layer 124d and the capacitor upper electrode 126d, and the structure and thickness thereof are substantially the same as those for the capacitor dielectric layer 124a and the capacitor upper electrode 126a in FIG. 2A.

As mentioned above, in case that the capacitor lower electrode 122d is formed of a conductive material layer, such as a cobalt silicide layer, which is resistant to heat and has a thermally stable sheet resistance, contact resistance between the conductive plug 120d and the capacitor $C_4$ can be reduced, thereby improving the operating speed of the semiconductor memory device.

Figure 2E:
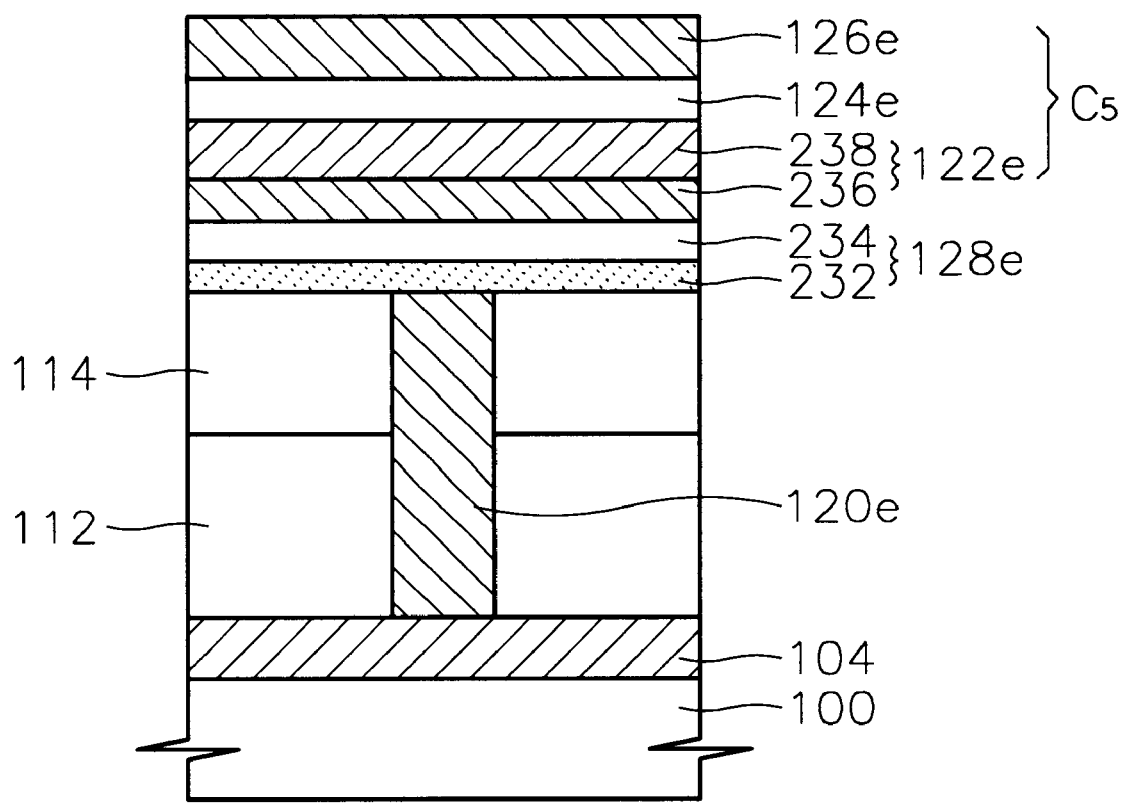

FIG. 2E illustrates a fifth embodiment of the conductive plug 120, the interface layer 128, and the capacitor C, which can be comprised in the semiconductor memory devices according to the present invention. Referring to FIG. 2E, a conductive plug 120e having a single-layered structure is formed through the second and first ILD films 114 and 112 on the semiconductor substrate 100. The conductive plug 120e contacts the impurity-doped region, for example, the source region 104 of the semiconductor substrate 100. The conductive plug 120e may be formed of substantially the same material as that of the lower plug 200 in FIG. 2A. For example, the conductive plug 120e may be formed of doped polysilicon. Also, an interface layer 128e, in which a silicide layer 232 and a diffusion barrier layer 234 are sequentially stacked, is formed on the conductive plug 120e and the second ILD film 114. The silicide layer 232 may be formed of substantially the same material as that of the upper plug 202 in FIG. 2A. For example, the silicide layer 232 may be a cobalt silicide layer and have a thickness of approximately 50 to 1000 Å. The diffusion barrier layer 234 may be formed of substantially the same material as that of the diffusion barrier layer 206 in FIG. 2A. For example, the diffusion barrier layer 234 may be formed of an Ir layer.

Also, a capacitor lower electrode 122e, in which a metal oxide layer 236 and a heat resistance metal layer 238 are sequentially stacked, is formed on the interface layer 128e. A capacitor dielectric layer 124e and a capacitor upper electrode 126e are sequentially stacked on the capacitor lower electrode 122e. The type of material used for the metal oxide layer 236, the heat resistance metal layer 238, the capacitor dielectric layer 124e and the capacitor upper electrode 126e, and the structure and thickness of these layers are substantially the same as those in FIG. 2A.

As mentioned above, in case that the silicide layer 232 such as a cobalt silicide layer, which is resistant to heat and has a thermally stable sheet resistance, is comprised in the interface layer 128e, contact resistance between the conductive plug 120e and the capacitor $C_5$ is reduced, thereby improving the operating speed of the semiconductor memory device.

Hereinafter, preferred embodiments of a semiconductor device manufacturing method according to the present invention will be described in greater detail with reference to the accompanied drawings.

Figure 3H:
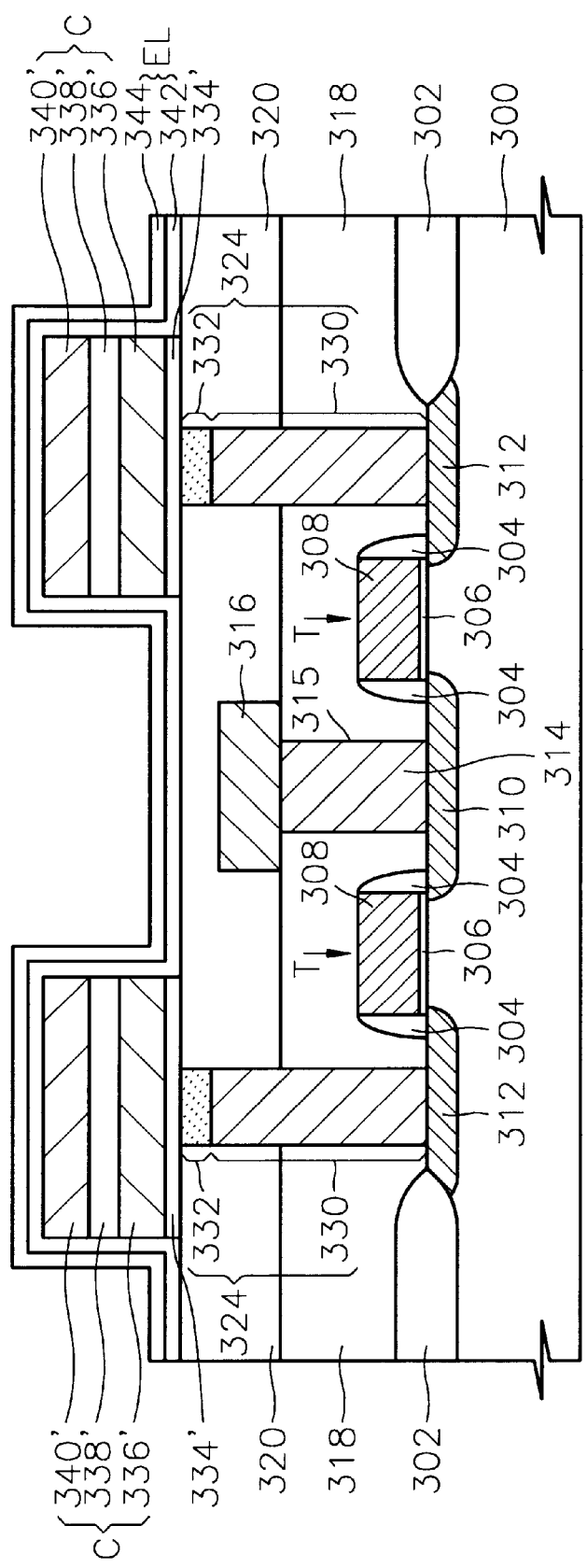

FIGS. 3A through 3J are sectional views illustrating the formation procedure of semiconductor memory device according to a first embodiment of the present invention. Referring to FIG. 3A, an isolation layer 302 is formed in a semiconductor substrate 300 to define an active region, and a transistor T is formed on the active region. The isolation layer 302 is formed by a general process, for example, a LOCOS process. A trench isolation technique can be used in forming the isolation layer 302 to define an active region. The transistor T may be a field effect transistor(FET) having a gate electrode 308, which has spacers 304 at its sidewalls and is formed on a gate insulating layer 306 on the semiconductor substrate 300, and a drain region 310 and a source region 312.

Following this, a landing plug 314 and a bit line contact pad 316 are formed by a common process. In particular, a first ILD film 318 is formed on the structure having the transistor T, and then the landing plug 314 is formed through the first ILD film 318 so that it contacts with the drain region 310 of the transistor T. In other words, an opening 315 is formed by photolithography to expose the impurity-doped region, for example, the drain region 310, and the opening 315 is filled with a conductive layer, for example, with a doped polysilicon layer. Then, the bit line contact pad 316 is formed on the landing plug 314. For the formation of the bit line contact pad 316, a conductive layer, for example, a doped polysilicon layer is deposited on the first ILD film 318, and patterned into the bit line contact pad 316 by photolithography. Then, a second ILD film 320 is formed on the bit line contact pad 316.

A variety of material layers may be used as the first ILD film 318 and the second ILD film 320, including, for example, a silicon oxide layer, a silicon oxynitride layer, a BSG layer, a PSG layer, a BPSG layer, a TEOS layer, an $O_3$-TEOS layer, a PE-TEOS layer, a USG layer and a composite layer of these layers. The first and second ILD films 318 and 320 can be formed by a general technique, for example, a CVD, LPCVD or PECVD process.

Subsequently, a contact hole 322 which exposes the source region 312 of the transistor T is formed through the first and second ILD films 318 and 320 by photolithography.

Referring to FIG. 3B, the contact hole 322 is filed with a conductive layer by a general technique to form a conductive plug 324. For example, a conductive layer is deposited on the entire surface of the semiconductor substrate 300 by a sputtering technique and planarized by a chemical mechanical polishing (CMP) or etchback technique until the surface of the second ILD film 320 is exposed. The conductive plug 324 may be formed of a doped polysilicon layer. More preferably, the conductive plug 324 is formed of a doped polysilicon layer, a W layer, a Ta layer, a Ru layer, an Ir layer, an Os layer, a Pt layer, a tungsten silicide layer, a cobalt silicide layer, a tungsten nitride layer or a composite layer of these layers.

After forming the conductive plug 324 in the contact hole 322, the entire surface of the semiconductor substrate 300 is subjected to a precleaning process, and then a natural oxide layer on the conductive plug 324 is removed. For example, when the conductive plug 324 is formed of doped polysilicon, the conductive plug 324 is contaminated by a natural oxide layer during transfer of the semiconductor substrate 300 for a subsequent process, or during the precleaning step. Thus, in order to prevent increase of contact resistance of the semiconductor memory device due to the natural oxide layer, the natural oxide layer must be removed prior to a subsequent process.

In particular, after the precleaning process, the semiconductor substrate 300 is cleaned by applying a particular frequency, for example, a radio frequency (RF) of 13.56 MHz, to the entire surface of the semiconductor substrate 300 in a dry state, so that the natural oxide layer is removed from the conductive plug 324. The RF cleaning process can be carried out by various methods. However, it is preferable to perform the cleaning process by using argon ions ($Ar^+$) accelerated by a strong electric field in a sputtering apparatus.

After removing the natural oxide layer formed on the conductive plug 324 by the above-mentioned cleaning process, a refractory metal layer 326 to have a high melting point and a planarization layer 328 are sequentially formed on the entire surface of the semiconductor substrate 300 by a common technique, for example, a sputtering or CVD method. When the conductive plug 324 is formed of a doped polysilicon layer, it is preferable to form the refractory metal layer 326 with a material layer which exhibits a good diffusion property toward the conductive plug 324 during a subsequent silicidation process, and have a stable resistance property at high temperatures, for example, a low sheet resistance, after being transformed into a suicide layer through the subsequent silicidation process. Thus, it is preferable to form refractory metal layer 326 of a cobalt layer. The refractory metal layer 326 may be formed of a Ni layer, a Ti layer, a Ta layer, a Hf layer or a Cr layer. When the conductive plug 324 is formed of a doped polysilicon layer, the refractory metal layer 326 acts as a source material layer during the subsequent silicidation process. Thus, preferably, the refractory metal layer 326 is formed to have a sufficient thickness in view of the thickness of a silicide layer to be formed by the subsequent silicidation process. The refractory metal layer 326 may have a thickness of approximately 50 to 200 Å, but more preferably, a thickness of approximately about 130 Å.

The planarization layer 328 serves to prevent the surface of the refractory metal layer 326 from becoming rough during the subsequent silicidation process, and to avoid diffusion of oxygen through the refractory metal layer 326 into the conductive plug 324 during the subsequent silicidation process. To this end, the planarization layer 328 may be formed of a TiN layer. Preferably, the planarization layer 328 is formed to have a thickness of approximately 50 to 150 Å, but more preferably, a thickness of approximately about 100 Å.

The steps of RF-cleaning, forming the refractory metal layer 326 and forming the planarization layer 328, preferably, are carried out in-situ in the same apparatus in order to reduce the number of steps required for semiconductor memory device manufacture.

Referring to FIG. 3C, after the formation of the refractory metal layer 326 and the planarization layer 328 illustrated in FIG. 3B, a heat treatment process is performed to induce a silicidation between the refractory metal layer 326 and the conductive plug 324. Preferably, the heat treatment process is performed by rapid thermal process(RTP) mode. For example, for the silicidation of the conductive plug 324, a rapid thermal process is carried out under a nitrogen atmosphere at a temperature of 400 to 1000° C., and more preferably, at about 480° C., for about 90 seconds. It is possible to vary the duration of the rapid thermal process depending on the desired thickness of a silicide layer. During the heat treatment process, atoms constituting the refractory metal layer 326, for example, Co atoms, continue to react with atoms constituting the conductive plug 324, for example, Si atoms, in a predetermined ratio. After the heat treatment process, a refractory metal silicide layer, which is resistant to oxidation, is formed at the upper portion of the conductive plug 324.

After the silicidation process, the planarization layer 328 (see FIG. 3B) and a portion of the refractory metal layer 326 (see FIG. 3B) which was not transformed to the silicide layer, are removed by a wet etching technique. For example, the planarization layer 328 and the non-silicidated portion of the refractory metal layer 326 may be removed by a solution containing phosphoric acid and nitric acid. Then, the resultant structure may be rapidly heat treated once more at 650° C. for reaction stabilization. For example, the rapid thermal process for reaction stabilization may be performed under a nitrogen atmosphere for about 30 seconds.

As a result of the silicidation process, a lower plug 330 composed of the conductive layer, which retains a material constituting the conductive plug 324, and an upper plug 332 composed of the refractory metal silicide layer are formed in the contact hole 322. For example, when the conductive plug 324 is formed of a doped polysilicon layer, the lower plug 330 of the doped polysilicon layer and the upper plug 332 of a cobalt silicide layer are formed in the contact hole 330.

The upper plug 332 of a silicide layer, for example, a cobalt silicide layer, which is formed at the upper portion of the conductive plug 324 through a series of steps described above, may be used as an ohmic contact layer. Preferably, the upper plug 332 has a thickness of approximately 30 to 1000 Å.

Referring to FIG. 3D, an interface layer 334 is formed over the upper plug 332 and the second ILD film 320. Although not illustrated in detail, the interface layer 334 may be formed by sequentially depositing an adhesion layer and a diffusion barrier layer over the upper plug 332 and the second ILD film 320.

The adhesion layer is formed of a material layer capable of enhancing adhesion between the upper plug 332 and the second ILD film 320, and the diffusion barrier layer. To this end, the adhesion layer may be formed of a transition metal layer, for example, a Ti layer. The thickness of the adhesion layer may be varied depending on the material layer selected to form the same, but preferably the adhesion layer is formed to have a thickness of approximately 10 to 200 Å. If the Ti layer is selected as the adhesion layer, the adhesion layer may be formed to have a thickness of approximately about 50 Å.

The diffusion barrier layer serves to prevent a reaction between a material layer to be formed on the interface layer 334 and the conductive plug 324 underneath the interface layer 334 during a subsequent process, and deterioration of the conductive plug 324 due to diffusion of oxygen during a subsequent process under an oxygen atmosphere. Preferably, the diffusion barrier layer is formed of a material layer appropriate for these functions. For example, the diffusion barrier layer may be formed of an Ir layer. Preferably, the diffusion barrier layer is formed of a Ti layer; a Ta layer; a W layer; a Ni layer; a Cr layer; an Ir layer; a Ru layer; a nitride, boride, carbide or silicide layer of these layers; or a composite layer of these layers. Also, the diffusion barrier layer may be formed of a Ti—Si—N series layer, a Ti—B—N series layer, a Ta—Si—N series layer, a Ta—B—N series layer, a Ta—Al—N series layer, a W—B—N series layer, a W—Si—N series layer, a Ti—Al series layer or a Ta—Al series layer. The thickness of the diffusion barrier layer may be varied depending on the material layer selected to form the same, but preferably the diffusion barrier layer is formed to have a thickness of approximately 40 to 1800 Å. If the Ir layer is selected as the diffusion barrier layer, the diffusion barrier layer may be formed to have a thickness of about 1100 Å.

After the formation of the interface layer 334, a lower conductive layer 336 is formed on the interface layer 334. Preferably, the lower conductive layer 336 is formed by sequentially depositing a metal oxide layer and a heat resistant metal layer on the interface layer 334.

The metal oxide layer, preferably, is formed of a material layer which has conductivity and is able to supply oxygen to the dielectric layer 338 when oxygen atoms are outgassed from the dielectric layer 338 on the lower conductive layer 336. For this function, the metal oxide layer may be formed of a $IrO_2$ layer. A variety material layers may be used as the metal oxide layer, including, for example, an $IrO_2$ layer, an $RuO_2$ layer, a $(Ca, Sr)RuO_3$ layer, and a composite layer of these layers. The metal oxide layer may be formed by a variety of processes including a CVD process, an ALD process, a PVD process and an LA process. However, the method adopted for forming the metal oxide layer may be varied depending on the material layer selected to form the same. If the $IrO_2$ layer is selected as the material layer for the metal oxide layer, a sputtering process may be used to form the metal oxide layer. Also, the metal oxide layer may have a thickness of approximately 100 to 1000 Å. If the $IrO_2$ layer is selected as the metal oxide layer, the metal oxide layer may be formed to have a thickness of approximately about 500 Å.

Preferably, the formation of the metal oxide layer is followed by a heat treatment process for crystallization of the metal oxide layer. The heat treatment temperature is varied depending on the material layer selected to form the metal oxide layer. If the $IrO_2$ layer is selected as the metal oxide layer, the metal oxide layer may be heated at 600° C.

Preferably, the heat resistant metal layer may be formed of a material layer with the capability of inducing crystal growth of the dielectric layer 338, which is formed on the lower conductive layer 336 later on, and of allowing uniform crystal growth thereof. To this end, it is preferable that the heat resistant metal layer is formed of a Pt layer. However, the heat resistant metal layer may be formed of a Pt layer, an Ir layer, a Ru layer, a Rh layer, an Os layer, a Pd layer or a composite layer of these layers. For the formation of the heat resistant metal layer, CVD, PVD, AD, sputtering or LA can be adopted. If the Pt layer is selected as the material layer for the heat resistant metal layer, a sputtering process preferably may be used to form the heat resistant metal layer. The thickness of the heat resistant metal layer is varied depending on the material layer selected to form the same, but preferably the heat resistant metal layer has a thickness of approximately 400 to 2500 Å. For example, in case that the Pt layer is selected as the heat resistant metal layer, the heat resistant metal layer may be formed to have a thickness of about 1500 Å.

After the lower conductive layer 336 has been formed, the dielectric layer 338 is formed on the lower conductive layer 336. The dielectric layer 338 may be formed of a $TiO_2$ layer, a $Ta_2O_5$ layer, an $Al_2O_3$ layer, a $BaTiO_3$ layer, a $SrTiO_3$ layer, a $Bi_4Ti_3O_{12}$ layer, a $PbTiO_3$ layer, a $SiO_2$ layer, a SiN layer, a $(Ba, Si)TiO_3$ layer, a $(Pb, La)(Zr, Ti)O_3$ layer, a $Pb(Zr, Ti)O_3$ layer, a $SrBi_2Ta_2O_9$ layer or a composite layer of these layers. For more enhancing the capacitance of a capacitor to be formed in a subsequent step, the dielectric layer 338 may be formed of a ferroelectric material layer. For example, the dielectric layer 338 may be a PZT layer, a BST layer, a PLZT layer or a composite layer of these layers. The method adopted in forming the dielectric layer 338 is varied depending on the material layer selected to form the dielectric layer 338. Preferably, the dielectric layer 338 may be formed of a PZT layer using a sol-gel method. Also, the thickness of the dielectric layer 338 is varied depending on the material layer selected to form the same, but preferably the dielectric layer 338 has a thickness of approximately 500 to 2000 Å. In case that the PZT layer is selected as the dielectric layer 338, the dielectric layer 338 may be formed to have a thickness of about 2000 Å.

The formed dielectric layer 338 is subjected to a heat treatment process in an oxygen atmosphere at a temperature of 600 to 900° C. In case that the PZT layer is selected as the dielectric layer 338, the dielectric layer 338 may be heat-treated at about 750° C. The heat treatment process makes the quality of the dielectric layer 338 dense, to thereby increase the capacitance of the capacitor and improve the leakage current characteristics. Meanwhile, because the heat treatment process is carried out under an oxygen atmosphere, the oxygen can be diffused into the conductive plug 324. However, since the interface layer 334 with the diffusion barrier layer, and the upper plug 332 formed of a refractory metal silicide layer such as cobalt silicide layer, are on the conductive plug 324, diffusion of oxygen into the lower plug 330 is prevented.

After the dielectric layer 338 has been formed, the upper conductive layer 340 is formed on the dielectric layer 338. A variety of material layers may be used as the upper conductive layer 340, including, for example, a heat resistant metal layer, a metal oxide layer and a composite layer of these layers. Here, the metal layer may include a Pt layer, an Ir layer, a Rh layer, an Os layer or a Pd layer, and the metal oxide layer may be a $RuO_2$ layer, an $IrO_2$ layer, a $(Ca,Sr)RuO_3$ layer and a $LaSrCoO_3$ layer. Preferably, the upper conductive layer 340 has a bilayered structure including an $IrO_2$ layer and an Ir layer stacked in sequence. The $IrO_2$ layer also supply oxygen for the dielectric layer 338, in case that oxygen atoms is outgassed from the dielectric layer 338. Of course, the thickness of the upper conductive layer 340 may be varied depending on the material layer selected to form same, but preferably the upper conductive layer 340 may have a thickness of approximately 500 to 3000 Å. In case that a bilayered structure, in which a metal oxide layer and a heat resistant metal layer are stacked in sequence, is selected as the structure of the upper conductive layer 340, the metal oxide layer may be formed to have a thickness of approximately 100 to 1000 Å while the heat resistant metal layer may be formed to have a thickness of approximately 400 to 2000 Å. In case that a bilayered structure, which comprises an $IrO_2$ layer and an Ir layer, is selected as the structure the upper conductive layer 340, the $IrO_2$ layer may be formed to have a thickness of approximately 300 Å while the Ir layer may be formed to have a thickness of approximately 1200 Å.

Referring to FIG. 3E, interface layer patterns 334', the capacitor lower electrodes 336', capacitor dielectric layers 338' and capacitor upper electrodes 340' are formed by patterning the interface layer 334, the lower conductive layer 336, the dielectric layer 338 and the upper electrode layer 340, respectively, in FIG. 3D. The patterning for the capacitor C may be performed in one, or two or more photolithography processes. Concerning the patterning by two photolithography processes to form the capacitor C, the upper conductive layer 340 is initially patterned to form the upper electrodes 340'. Next, the dielectric layer 338, the lower conductive layer 336 and the interface layer 334 are patterned to form the capacitor dielectric layers 338', the capacitor lower electrodes 336' and the interface layer patterns 334'. Concerning the patterning by three photolithography processes to form the capacitor C, the upper conductive layer 340, the dielectric layer 338 and the lower conductive layer 336, and the interface layer 334 may be patterned by separate photolithography processes. Alternatively, the upper conductive layer 340 and the dielectric layer 338 may be patterned by separate photolithography processes, and the lower conductive layer 336 and the interface layer 334 may be simultaneously patterned by another photolithography process.

Referring to FIGS. 3F and 3G, in comparison with the capacitor C shown in FIG. 3E, if the two or three photolithography processes are performed to form the capacitor C, a capacitor C may have a stepped sidewall profile. FIG. 3F illustrates the capacitor C obtained by performing two photolithography processes, and FIG. 3G illustrates a capacitor C obtained by performing three photolithography processes.

After the formation of the capacitor C has been completed, preferably, the structure is subjected to a heat treatment process in an oxygen atmosphere at a temperature of approximately 450 to 600° C. The heat treatment process stabilize the capacitor C and recover damage of the capacitor C caused during the etching process performed to form the capacitor C. In particular, in case that a cobalt silicide layer, which exhibits a stable sheet resistance even at a temperature of 900° C., is selected as the upper plug 332 of the conductive plug 324, deterioration in contact resistance between the capacitor C and the lower plug 330 can be effectively avoided during a high temperature heat treatment process performed at a temperature of 600° C. or more, which is performed after the formation of the metal oxide layer of the lower conductive layer 336, and the dielectric layer 338, or after the formation of the capacitor C.

As in the above, once the capacitor C is formed, the capacitor C is subjected to an ILD process, an IMD process and a passivation process. However, these processes may deteriorate the dielectric properties of the capacitor dielectric layer 338'. For instance, a hydrogen based gas, for example, hydrogen gas, which is produced during the ILD, IMD and passivation processes, may cause deterioration of the capacitor dielectric layer 338'. Therefore, for the purpose of protecting the capacitor C from contaminants such as hydrogen produced in a subsequent process performed after the formation of the capacitor C, a functional layer, by which the capacitor C is encapsulated, is formed. The semiconductor memory device manufacturing method according to the present invention provides an encapsulating layer EL with a multi-layered structure for such a functional layer.

It is desirable for the encapsulating layer EL to have the following functions. First, volatilization of the capacitor dielectric layer 338' must be prevented by the encapsulating layer EL. In particular, when the capacitor dielectric layer 338' is formed of a ferroelectric layer, such as a PZT layer, a BST layer or a PLZT layer, the volatilization thereof must be prevented in a subsequent integration process by the encapsulating layer EL. This is because the volatilization of the ferroelectric layer deteriorates the capacitor C, so that its intrinsic function of storing information by accumulating charges may disappear. Second, the encapsulating layer EL must not react with the capacitor dielectric layer 338'. Third, the encapsulating layer EL must prevent diffusion of a hydrogen based gas into the capacitor dielectric layer 338' during the subsequent integration processes. Fourth, the encapsulating layer EL must effectively block diffusion of the hydrogen based gas, which is entrapped in an ILD film, an IMD layer or a passivation layer during the subsequent integration processes, into the capacitor dielectric layer 338'.

In order to meet the above-mentioned requirements, the present invention provides an encapsulating layer EL including both a blocking layer and a capacitor protective layer. The main function of the capacitor protection layer is to prevent diffusion of the hydrogen based gas into the capacitor dielectric layer 338' during the subsequent integration processes. The blocking layer, which is formed under the capacitor protection layer, prevents a reaction between a material layer formed under the blocking layer and the capacitor protection layer, and/or prevents volatilization of the capacitor dielectric layer 338'. It is appreciated that the blocking layer and the capacitor protection layer differ in their main functions, however, all the above-mentioned functions required can be met by the combination of these two layers of the encapsulating layer EL. The functions of the blocking layer and the capacitor protection layer are embodied mostly in the formation of the encapsulating layer EL or in the integration processes following the capacitor formation. The effect of the function of the two layers will be described later in detail.

In the case where the encapsulating layer EL is formed as a multi-layer, the encapsulating layer EL can be constructed to have the following structure for covering the capacitor C. For example, in the case of forming a triple-layered encapsulating layer EL, the encapsulating layer EL is formed by sequentially stacking a blocking layer, a buffer layer and a capacitor protection layer to cover the capacitor C. In the case of forming a bilayered encapsulating layer EL, a blocking layer and a capacitor protection layer are stacked sequentially to cover the capacitor C. The number of material layers stacked to form the encapsulating layer EL, and the structure thereof may be varied. The number of material layers to be stacked to form the encapsulating layer EL is determined by considering constraints and so on of the encapsulating layer EL forming process.

Referring to FIG. 3H, a first embodiment of the semiconductor memory device manufacturing method according to the present invention, provides a bilayered encapsulating layer EL. A blocking layer 342 is initially formed over the semiconductor substrate 300 to directly cover the capacitor C. Next, a capacitor protection layer 344 is directly formed on the blocking layer 342. A material layer for the blocking layer is selected by taking into account the function which the blocking layer 342 is required to produce. Preferably, the blocking layer 342 may be formed of a $TiO_2$ layer, a $Ta_2O_5$ layer, a $BaTiO_3$ layer, a $SrTiO_3$ layer, a $Bi_4Ti_3O_{12}$ layer or a $PbTiO_3$ layer. Preferably, a material layer, which does not react with the capacitor protection layer 344, is selected to form the blocking layer 342. Thus, it is preferable that a material layer used as the blocking layer is selected depending on the material layer used to form the capacitor dielectric layer 338'. For example, if a ferroelectric layer, such as a PZT layer, a BST layer or a PLZT layer is selected as the capacitor dielectric layer 338', the blocking layer 342 may be formed of a $TiO_2$ layer. Also, the thickness of the blocking layer 342 is determined according to the required function of the blocking layer 342, the physical and chemical properties of material layer selected to form the blocking layer 342, and the like. Preferably, the blocking layer 342 is formed to have a thickness of 50 to 1500 Å.

On the other hand, a specific method used to form the blocking layer 342 varies depending on the type of material layer selected to form the same. This is so because the process of forming the blocking layer 342 can be varied for easier applications depending on the material layer selected from the above-mentioned material layers as the blocking layer 342. A variety of processes may be applied to form the blocking layer 342, including, for example, CVD, PVD, sputtering, ALD and LA processes. However, if a $TiO_2$ layer is used as the blocking layer 342, the sputtering process is preferred. As a matter of course, processes other than the sputtering process can be applied in the formation of the blocking layer 342.

For example, in the case of forming the blocking layer 342 of a $TiO_2$ layer by the sputtering method, titanium can be used as a target material, Ar gas can be used as a sputtering gas and $O_2$ gas can be used as a reaction gas. In the case where a DC sputtering apparatus is used to form the blocking layer 342, the process conditions may be set as follows. The power applied to the DC sputtering apparatus may be 1~6 kW, the temperature of a chamber may be set to 25~700° C., and the pressure of the chamber may be adjusted to 1~5 mTorr. Also, the flow rate of Ar gas and $O_2$ gas may be maintained at 8–14 sccm. More preferably, the sputtering to form the blocking layer 342 is applied under the conditions of a power of about 6 kW, a temperature of the chamber at about 630° C., a chamber pressure of about 1 mtorr, an Ar gas flow rate of about 10 sccm, and an $O_2$ gas flow rate of about 10 sccm.

A material layer to be formed as the capacitor protection layer 344 is selected taking into account the function which the capacitor protection layer 344 is required to produce. Preferably, the capacitor protection layer 344 may be a $TiO_2$ layer, $Ta_2O_5$ layer, an $Al_2O_3$ layer, a $BaTiO_3$ layer, a $SrTiO_3$ layer, a $Bi_4Ti_3O_{12}$ layer or a $PbTiO_3$ layer. The type of material layer used as the capacitor protection layer 344 depends on the material layers selected to form the capacitor dielectric layer 338' and the blocking layer 342. For example, it is undesirable to select a material layer, which can react with the blocking layer 342, as the capacitor protection layer 344. Preferably, the capacitor protection layer 344 is formed of a material layer which is different from the blocking layer 342, but more preferably, of an $Al_2O_3$ layer.

The thickness of the capacitor protection layer 344 is determined taking into account the function of the capacitor protection layer 344 and the physical and chemical properties of the material layer selected to form the same. Preferably, the capacitor protection layer 344 is formed to have a thickness of approximately 50~5000 Å, but more preferably a thickness of approximately 50~1500 Å. If the thickness of the capacitor protection layer 344 exceeds 1500 Å, the capacitor protection layer 344 may be used as an ILD film, so that there may be no need to perform the ILD process later on.

The process used to form the capacitor protection layer 344 may vary according to which material layer is selected from the material layers mentioned above as the capacitor protection layer 344, due to the same reason as in the formation of the blocking layer 342. A variety of processes may be applied to form the capacitor protection layer 344, including, for example, CVD, PVD, sputtering, ALD and LA processes.

However, the use of an ALD process is more preferable in forming the capacitor protection layer 344 due to the following advantages. That is, the ALD process can be carried out at low temperatures. Also, the ALD process results in a physically and chemically stable capacitor protection layer, so that the above-mentioned function of the capacitor protection layer 344 can be enhanced. Also, in forming the capacitor protection layer 344 by the ALD process, single atomic layers are repeatedly stacked, which allows for accurate control of the thickness of the capacitor protection layer 344. Also, no matter how complicated the topology of a surface on which the capacitor protection layer 344 is to be formed, the capacitor protection layer 344 can be formed to provide a 100% step coverage.

When the capacitor protection layer 344 is formed of an $Al_2O_3$ layer by the ALD process, an aluminum source gas is initially pulsed over the upper surface of a semiconductor substrate loaded into a chamber of an ALD apparatus. Trimethyl aluminum (TMA), dimethylaluminum hydride (DAMH), dimethylethylamine alane (DMEAA), triisobutylaluminum (TIBA) or a composite gas of these gases can be used as the aluminum source gas. The pulsed aluminum source gas is chemically or physically adsorbed onto the entire surface of the semiconductor substrate. Then, after removing the aluminum source gas remaining in the chamber, the upper surface of the semiconductor substrate is purged with an inert gas to remove the aluminum source gas physically adsorbed onto the surface of the semiconductor substrate. The inert gas may be an Ar gas, a $N_2$ gas, a $N_2O$ gas or a composite gas of these gases. Then, an oxygen source gas is pulsed over the upper surface of the semiconductor substrate. The oxygen source gas may be a $H_2O$ gas, a $N_2O$ gas, an $O_3$ gas or a composite gas of these gases. A reaction between the aluminum source gas and the oxygen source gas occurs only on the upper surface of the semiconductor substrate onto which the aluminum source gas has been chemically adsorbed, so that a thin film having a thickness level of a single or more atomic layer is formed. Thereafter, the remaining oxygen source gas is removed from the chamber, the upper surface of the semiconductor substrate is purged with an inert gas selected from the above-mentioned inert gases to remove the oxygen source gas which has been physically adsorbed onto the surface of the semiconductor substrate. The formation of the thin film having a thickness level of a single or more atomic layer is referred to as 1 cycle of the ALD process. A predetermined number of cycles of the ALD process are repeated until the capacitor protection layer 344 reaches a desired thickness, for example, 100 Å.

In forming the capacitor protection layer 344 of an $Al_2O_3$ layer by the ALD process, the temperature of the substrate may be in the rage of 150 to 500° C., but more preferably, approximately 300° C. Also, the pulsing time of the aluminum source gas may be 0.1~2 seconds, but more preferably is about 1 second. Also, the purging time of the inert gas for removing the physically adsorbed aluminum source gas may be 0.1~10 seconds, but more preferably is about 5 seconds. The pulsing time of the oxygen source gas may be 0.1~20 seconds, but more preferably is about 0.2 seconds. The purging time of the inert gas for removing the physically adsorbed oxygen source gas may be 0.1~20 seconds, but more preferably is about 6 seconds.

Also, in order to further improve the function of the encapsulating layer EL, an optional heat treatment process may be performed after the formation of the blocking layer 342 and/or the formation of the capacitor protection layer 344. In detail, after the formation of the blocking layer 342, a heat treatment process under an $O_2$ atmosphere may be performed in order to enhance the dielectric properties of the blocking layer 342. Preferably, the heat treatment process is performed at a temperature of 600° C. or less. This is because, when the blocking layer 342 is heat-treated at a high temperature of, for example, 600° C. or more, oxygen may diffuse into the conductive plug 324. More preferably, the heat treatment process is performed at a temperature of approximately 400 to 600° C.

After the formation of the capacitor protection layer 344, an optional heat treatment process may be performed under an $O_2$ atmosphere, preferably, at a temperature of 600° C. or less, in order to enhance the dielectric properties of the capacitor protection layer 344. Preferably, the heat treatment process may be performed at a temperature of approximately 400~600° C.

In a certain case, an heat treatment process at a high temperature of 600° C. or more may be performed after the formation of the capacitor protection layer 344. This is because the conductive plug 324 may be not susceptible to the diffusion of oxygen due to the completed encapsulating layer EL. In the case where a process other than the ALD process is adopted to form the capacitor protection layer 344, preferably, a heat treatment process may be performed after the formation of the capacitor protection layer 344. This is associated with the chemical and physical stability of the capacitor protection later 344 depending on the process selected to form the capacitor protection layer 344. In other words, because the capacitor protection layer 344 formed by the ALD process is relatively more stable than capacitor protection layers formed by other processes, the ALD process permits the capacitor protection layer 128 to be effective without undergoing a heat treatment process. However, in the case where the capacitor protection layer 344 is formed by other processes besides the ALD process, the dielectric properties of the capacitor protection layer 344 need to be enhanced through a heat treatment process at 600° C. or more. Particularly, in the case where a heat treatment precess is not performed after the formation of the blocking layer 342 and the capacitor protection layer 344 is formed by a process other than the ALD process, it is preferable to perform an annealing process at a temperature of 600° C. or more.

Meanwhile, because the capacitor protection layer 344 formed by the ALD process is stable, the diffusion of oxygen into the conductive plug 324 during the heat treatment process can be reliably prevented, thereby increasing a processing margin in the heat treatment process on the capacitor protection layer 344.

By covering the capacitor C with the encapsulating layer EL as described above, deterioration of the capacitor C in subsequent processes can be prevented, which will now be described.

Figure 3I:
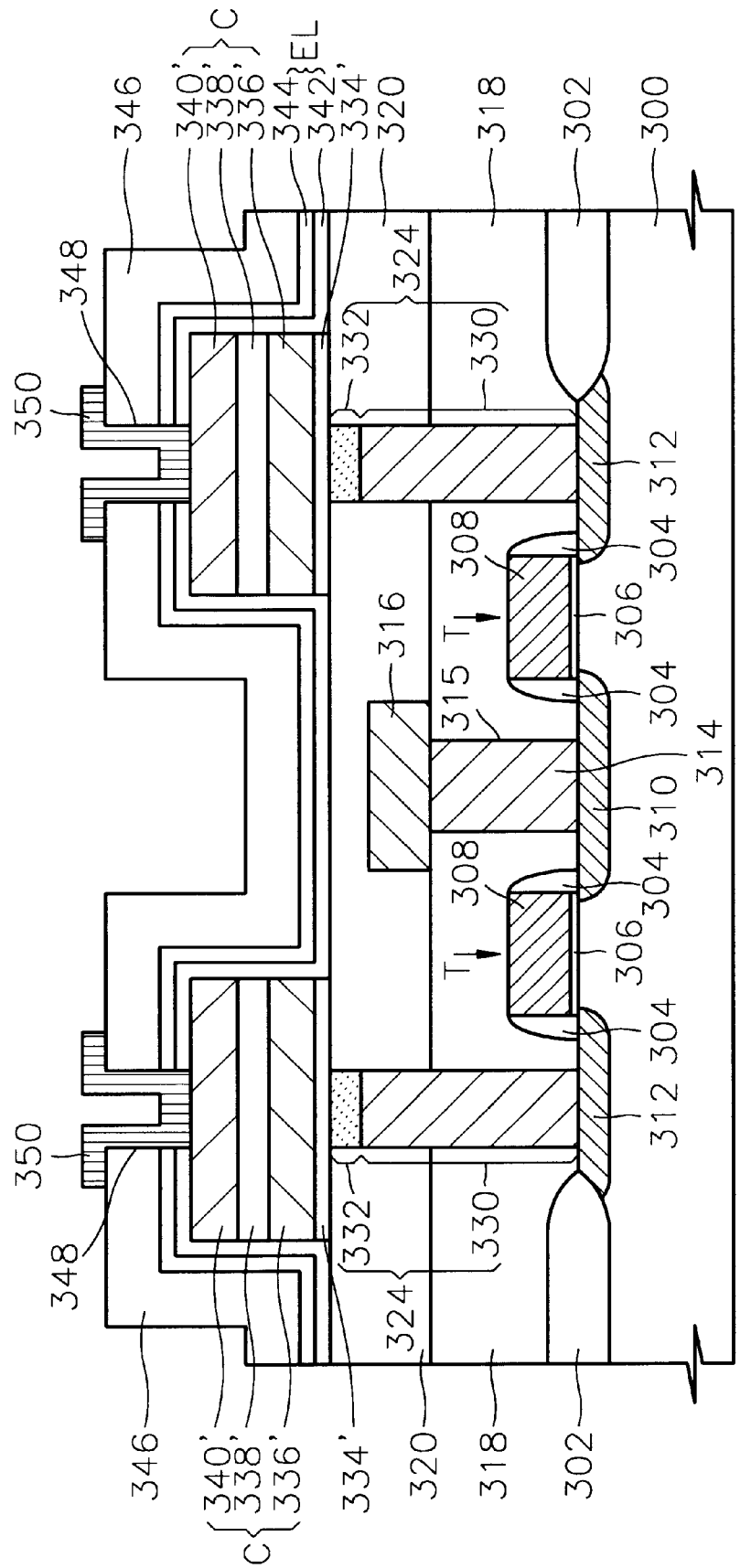

Referring to FIG. 3I, after the formation of the encapsulating layer EL, the ILD process is performed. That is, an third ILD film 346 is formed over the entire surface of the semiconductor substrate 300. The third ILD film 346 may be formed of a silicon oxide layer, a silicon oxynitride layer, a BSG layer, a PSG layer, a BPSG layer, a TEOS layer, an $O_3$-TEOS layer, a PE-TEOS layer, a USG layer or a composite layer of these layers.

For example, in the case of forming the third ILD film 346 of a silicon oxide layer by the CVD process, a silane gas ($SiH_4$) and an oxygen ($O_2$) gas are used as reaction gases. Hydrogen, which is derived from the reaction between the silane gas and oxygen gas, may degrade the capacitor dielectric layer 338'. However, because the capacitor C according to the present invention is covered with the encapsulating layer EL having a bilayered structure, the diffusion of hydrogen into the capacitor C during the ILD process can be essentially blocked. The capacitor protection layer 344 of the encapsulating layer EL particularly contributes to blocking the diffusion of hydrogen. The blocking layer 342 also contributes to preventing the diffusion of hydrogen although its contribution is not necessarily higher than that of the capacitor protection layer 344.

Thereafter, a metallization process is performed. In particular, the third ILD film 346, the capacitor protection layer 344 and the blocking layer 342 are initially patterned by a general process, to form a contact hole 348 which exposes part of the capacitor upper electrode 340'. The third IDL film 346 may be patterned by fluorine-based wet or dry etching. Also, reactive ion etching may be used to pattern the capacitor protection layer 344 and the blocking layer 342 under Ar and $CF_4$ atmospheres. After the contact hole 348 has been formed, an upper electrode metal contact 350 is formed. After the formation of the contact hole 348, a recovery heat treatment process may be performed. The recovery heat treatment process may be performed at a temperature of, for example, 450 to 500 °C., under an $O_2$ atmosphere. Although not shown in FIG. 3I, a lower electrode metal contact may be formed along with the upper electrode metal contact 350.

Referring to FIG. 3J, after the upper electrode metal contact 350 has been formed, the structure is subjected to a passivation process for forming a passivation layer 352. The passivation layer 352 may be formed of a silicon oxide layer, a silicon nitride layer, a silicon oxynitride layer or a composite layer of these layers, but more preferably of a silicon nitride layer or a silicon oxynitride layer. The passivation layer 352 is formed to have a thickness of approximately 2000 to 20000 Å. A variety of processes can be applied to form the passivation layer 352, including, for example, a CVD process, a PVD process, a ALD process, a sputtering process or an LA process, but a PECVD process is more preferred to form the passivation layer 352.

In the case of forming the passivation layer 352 of a silicon nitride layer using the PECVD process, an RF power of 300 to 600 W, preferably, of about 400 W, may be applied to a apparatus used in forming the passivation layer 352. Also, the pressure of a reaction chamber may be in the range of 1 to 15 torr, but preferably at about 5 torr. The temperature of the reaction chamber may be in the range of 150 to 500 °C., preferably, at about 300° C. The flow rate of a silane ($SiH_4$) gas supplied as a reaction gas may be in the range of 50 to 500 sccm, preferably, at about 150 sccm. Also, the flow rate of an ammonia ($NH_4$) gas used as a reaction gas may be in the range of 20 to 200 sccm, preferably, at about 40 sccm.

Also, in the case that the passivation layer 352 is formed of a silicon oxynitride layer performing the PECVD process, the pressure and temperature of the reaction chamber are substantially the same as in the case that the passivation layer 352 is formed of the silicon nitride layer. Preferably, the flow rate of the silane gas ($SiH_4$) used as a reaction gas may be in range of 10 to 200 sccm, and more preferably, at about 50 sccm. The flow rate of the ammonia gas ($NH_4$) used as a reaction gas may be in the range of 20 to 500 sccm, preferably, at about 150 sccm. Also, the flow rate of a $N_2O$ gas as a reaction gas may be in the range of 20 to 500 sccm, preferably, at about 150 sccm.

During the formation of the passivation layer 352, hydrogen-based gas may diffuse into the capacitor C as in the ILD process. However, the capacitor protection layer 344 protects the capacitor C from the diffusion of the hydrogen-based gas, so that deterioration of the capacitor C can also be prevented during the passivation process. Of course, the blocking layer 342 also contributes to preventing the diffusion of hydrogen although its contribution is not necessarily higher than that of the capacitor protection layer 344.

The removal of part of the encapsulating layer EL formed on the capacitor upper electrode 340' during the formation of the contact hole 348 for the upper electrode metal contact 350 has been previously described. For this reason, the hydrogen-based gas may enter the capacitor upper electrode 340' through the removed part of the encapsulating layer EL during the passivation process. Also, because the passivation layer 352 itself contains a entrapped hydrogen-based gas, the hydrogen-based gas entrapped therein may diffuse into the capacitor C even after the passivation process, which in turn deteriorates the capacitor dielectric layer 338'. To avoid the deterioration problem of the capacitor dielectric layer 338 by the diffusion of hydrogen, the hydrogen barrier layer 354 may be optionally formed prior to performing the passivation process. The hydrogen barrier layer 354 blocks the diffusion of the hydrogen-based gas, which occurs during or after the formation of the passivation layer 352, thereby preventing the deterioration of the capacitor dielectric layer 338'.

The hydrogen barrier layer 354 provides substantially the same function as that of the capacitor protection layer 344 which constitutes the encapsulating layer EL. Accordingly, the physical, chemical and crystalline properties required for the hydrogen barrier layer 354 are substantially the same as those of the capacitor protection layer 344. The hydrogen barrier layer 354 may be formed of a $Al_2O_3$ layer, a $TiO_2$ layer, a $Ta_2O_5$ layer, a $BaTiO_3$ layer, a $SrTiO_3$ layer, a $Bi_4Ti_3O_{12}$ layer, a $PbTiO_3$ layer or a composite layer of these layers. Preferably, the hydrogen barrier layer 354 is formed of the $Al_2O_3$ layer. A variety of processes can applied to form the hydrogen barrier layer 354, including, for example, a CVD process, a PVD process, a sputtering process, a ALD process and a LA process. Preferable, the ALD process is applied to form the hydrogen barrier layer 354. Advantages of using the ALD process in forming the hydrogen barrier layer 354 are also substantially the same as those obtainable in forming the capacitor protection layer 344 by using the ALD process. Also, desirable processing conditions for the ALD process in forming the hydrogen barrier layer 354 are substantially the same as those that were applied to form the passivation protection layer 344 by using the ALD process.

Preferably, the hydrogen barrier layer 354 has a thickness of 50 to 20000 Å, but more preferably a thickness of 200 to 300 Å.

Although not shown, a buffer layer may be optionally formed of an oxide layer prior to the formation of the hydrogen barrier layer 354. In forming the buffer layer, an APCVD process or a PECVD process can be applied. For example, in case that the buffer layer is formed by the APCVD process, the buffer layer may be formed of a $O_2$-TEOS layer, a PSG layer or a BPSG layer. In case that the PECVD process is applied to form the buffer layer, the buffer layer may be formed of a PE-TEOS layer or a PE-$SiH_4$ layer.

Preferably, in case of forming the buffer layer by the PECVD process, a silane gas or a TEOS gas is used as a reaction gas. When the buffer layer is formed of a PE-TEOS layer by the PECVD process, preferably, the RF power may be in the range of 100 to 500 W, but preferably is 200 W. The pressure of the reaction chamber is in the range of 1 to 15 torr, but preferably is 5 torr. Preferably, the temperature of the reaction chamber is in the range of 150 to 450° C., but more preferably is 300° C.

As described previously with reference to FIGS. 3A and 3I, the ILD process and the passivation process are performed after the capacitor C is covered with the encapsulating layer (EL), so that the deterioration of the capacitor dielectric layer 338' can be prevented. In addition, the hydrogen barrier layer 354 may be further formed prior to performing the passivation process, so that deterioration of the capacitor dielectric layer 338', which occurs during subsequent semiconductor integration processes performed after the formation of the capacitor C, can be more effectively prevented.

A second embodiment of the semiconductor memory device manufacturing method according to the present invention follows the steps of the first embodiment, except that the conductive plug 324 (see FIG. 3B) is formed of doped polysilicon and the entire conductive plug 324 (see FIG. 3B) is transformed into a silicide layer during a subsequent silicidation process.

In the second embodiment, since the silicidation is applied to transform the entire conductive plug 324 (see FIG. 3B) into a suicide layer, it is preferable to form the refractory metal layer 326 (see FIG. 3B), which is used as a source material layer during the silicidation process, to be thicker than in the first embodiment. Preferably, the refractory metal layer 326 (see FIG. 3B) is formed to have a thickness of 130 Å or more, such that the refractory metal layer still remains after the silicidation process. The heat treatment for silicidation of the entire conductive plug 324 (see FIG. 3B) is performed under processing conditions substantially the same as in the first embodiment.

A third embodiment of the semiconductor memory device manufacturing method according to the present invention is different from the first embodiment in that a refractory metal silicide layer, for example, a cobalt silicide layer, is formed in the interface layer 334 (see FIG. 3D) rather than in the upper plug 332 (see FIG. 3C).

Figure 4A:
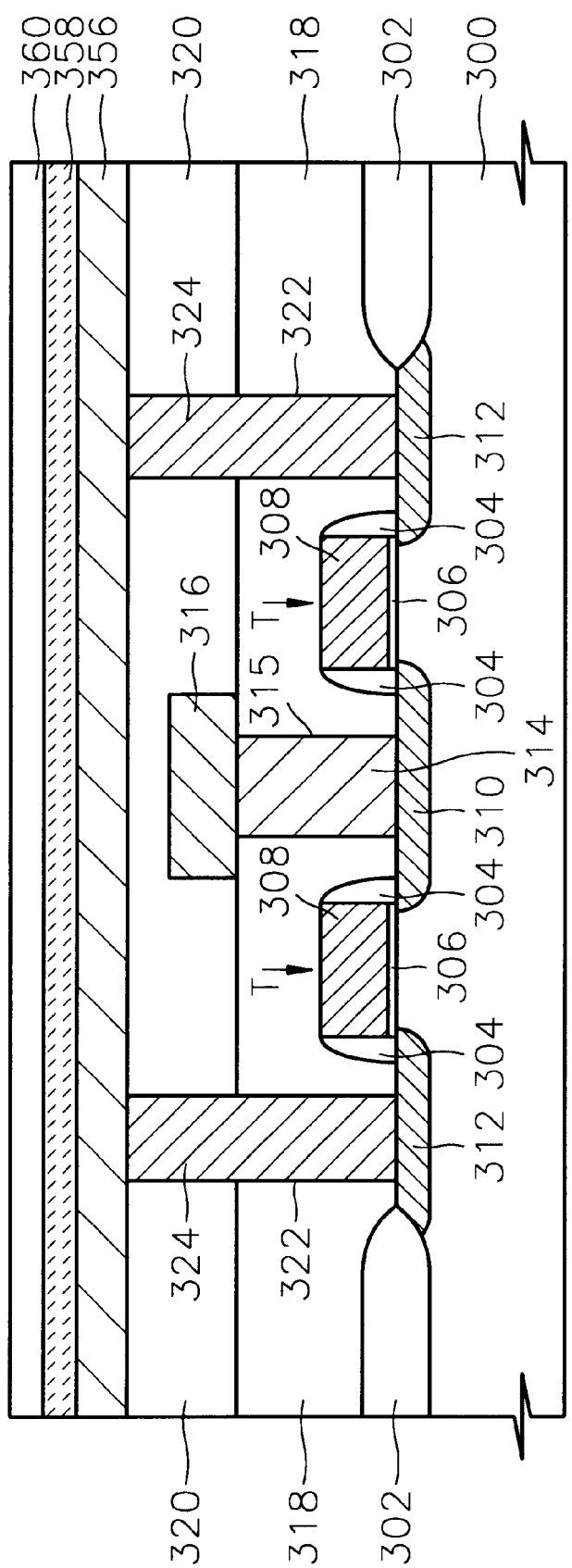
FIGS. 4A and 4B are sectional views illustrating a second embodiment of a method of manufacturing a semiconductor memory device according to the present invention.

Referring to FIG. 4A, the conductive plug 324 is formed through the first and second ILD films 318 and 320 by the steps which are substantially the same as in the first embodiment. The conductive plug 324 may be formed of a material layer which is substantially the same as the material layer of the lower plug 330 (see FIG. 3C). For example, the conductive plug 324 may be formed of a doped polysilicon layer. Next, a conductive layer 356, a refractory metal layer 358 and a planarization layer 360 are sequentially stacked over the conductive plug 324 and the second ILD film 320. The conductive layer 356 may be formed of a material layer which is substantially the same as the lower plug 330 shown in FIG. 3C. For example, the conductive layer 356 may be formed of a doped polysilicon layer to have a thickness of approximately 3000 to 10000 Å. The refractory metal layer 358 may be formed of a material layer which is substantially the same as the material layer of the metal layer 326 shown in FIG. 3B. For example, the refractory metal layer 358 may be formed of a cobalt layer to have a thickness of approximately 50 to 200 Å. The planarization layer 360 may be formed of a material layer which is substantially the same material layer of the planarization layer 328 shown in FIG. 3B. For example, the planarization layer 360 may be formed of a titanium nitride layer to have a thickness of approximately 50 to 150 Å.

In the case where a doped polysilicon layer is used as the conductive layer 356, a natural oxidation layer may be formed on the surface of the conductive layer 356. Accordingly, it is preferable to remove the natural oxide layer from the conductive layer 356 prior to the formation of the refractory metal layer 358. The technique used to remove such a natural oxide layer has been described in the first embodiment, and thus a description thereof will not be repeated.

Figure 4B:
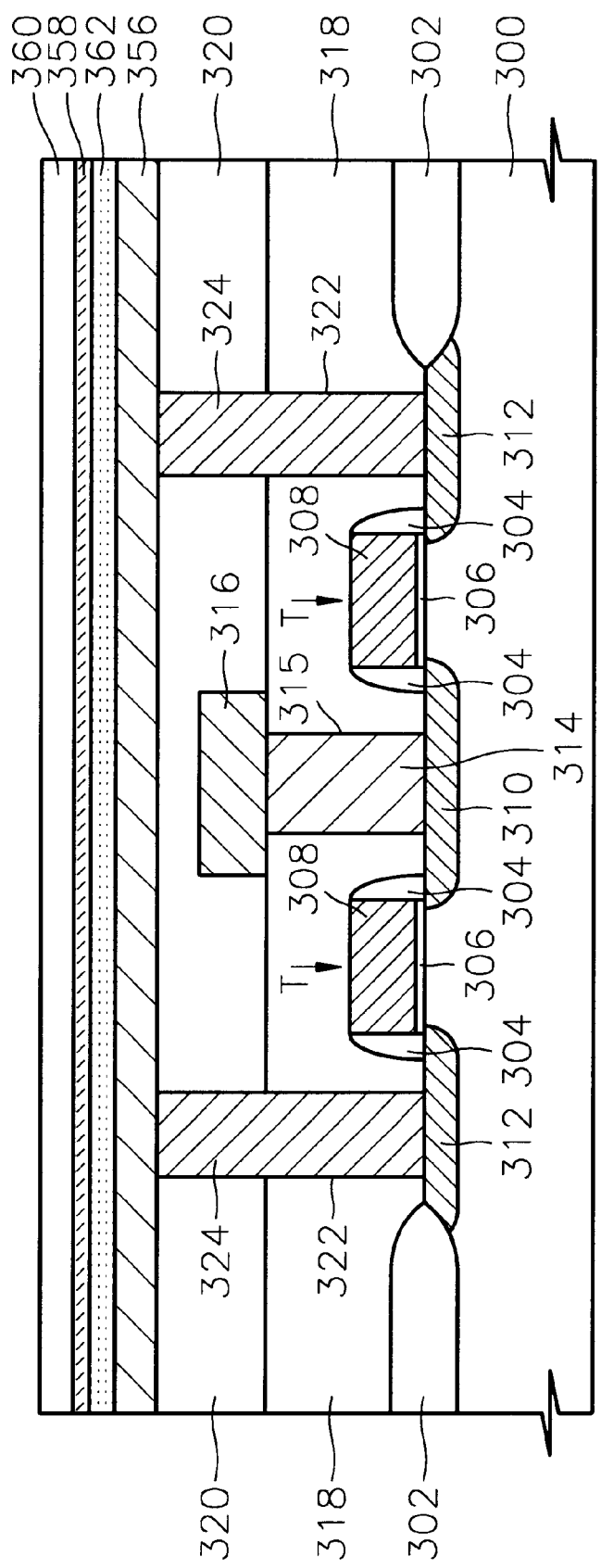

Referring to FIG. 4B, after the conductive layer 356, the high-melting point metal layer 358 and the planarization layer 360 have been deposited, a c heat treatment process is performed on the structure to convert an upper portion of the conductive layer 356 into a silicide layer 362. For example, when the high-melting point metal layer 358 is formed of a cobalt layer, the upper portion of the conductive layer 356 is converted into a cobalt silicide layer during the heat treatment for silicidation. The heat treatment process for silicidation is carried out by steps which are substantially the same as in the silicidation for forming the upper plug 332 shown in FIG. 3C.

After the heat treatment process for silicidation of the conductive plug 356, the planarization layer 360 and a portion of the refractory metal layer 358, which was not transformed into the silicide layer, are removed. A technique of removing the nonreacted portion of the refractory metal layer 358 and the planarization layer 360 is substantially the same as that used in the first embodiment of the semiconductor memory device manufacturing method.

After the planarization layer 360 and the nonreacted portion of the refractory metal layer 358 have been removed, a diffusion barrier layer (not shown) is formed on the silicide layer 362. The steps from the formation of the diffusion barrier layer up to a completed semiconductor memory device are substantially the same as in the first embodiment, and thus a description thereof will not be repeated.

In the above-mentioned second embodiment of the semiconductor memory device manufacturing method according to the present invention, the conductive plug 324 and the conductive layer 356 are obtained by separate processes. However, the conductive plug 324 and the conductive layer 356 may be formed by a single step so as to reduce the number of processing steps. For example, doped polysilicon may be deposited over the second ILD film 320, thereby filling the contact holes 322, and then the polysilicon layer on the second ILD film 320 is planarized until a predetermined thickness of the polysilicon layer remains on the second ILD film 320. By doing this, the conductive plug 324 and the conductive layer 356 can be obtained by a single process.

A fourth embodiment of the semiconductor memory device manufacturing method according to the present invention substantially follows the steps of the third embodiment, except that the formation of the diffusion barrier layer and the lower conductive layer is omitted. In other words, the silicide layer, for example, a cobalt silicide layer, formed in the fourth embodiment of the manufacture of the semiconductor memory device, serves as both a diffusion barrier layer and a capacitor lower electrode, and thus there is no need to separately form the diffusion barrier layer and the lower conductive layer.

Also, because the silicide layer, for example, a cobalt silicide layer, formed by the silicidation process, is used as the capacitor lower electrode in the fourth embodiment, it is preferable that the conductive layer 356 (see FIG. 4A) is formed to be thick enough to be used as a silicon source during the silicidation. Preferably, the conductive layer 356 (see FIG. 4A) has a thickness of approximately 3000 to 10000 Å. In addition, preferably, the processing conditions for the silicidation process are controlled to form a silicide layer 362 (see FIG. 4B) having a thickness of approximately 3000 to 1000 Å.

A fifth embodiment of the semiconductor memory device manufacturing method according to the present invention follows steps which are substantially the same as in the third embodiment of the present invention. However, the fifth embodiment of the semiconductor memory device manufacturing method differs from the third embodiment thereof in that a silicide layer and a barrier diffusion layer are sequentially formed over the conductive plug and the second ILD film prior to the formation of the lower conductive layer, and the silicide layer is formed by a CVD or sputtering process. Preferably, the silicide layer is formed of a material layer which is substantially the same as the upper conductive plug 332 shown in FIG. 3C, and has a thickness of approximately 50 to 1000 Å. The diffusion barrier layer may be formed of a material layer which is substantially the same as the diffusion barrier layer comprised in the interface layer 334 shown in FIG. 3D.

Figure 5:
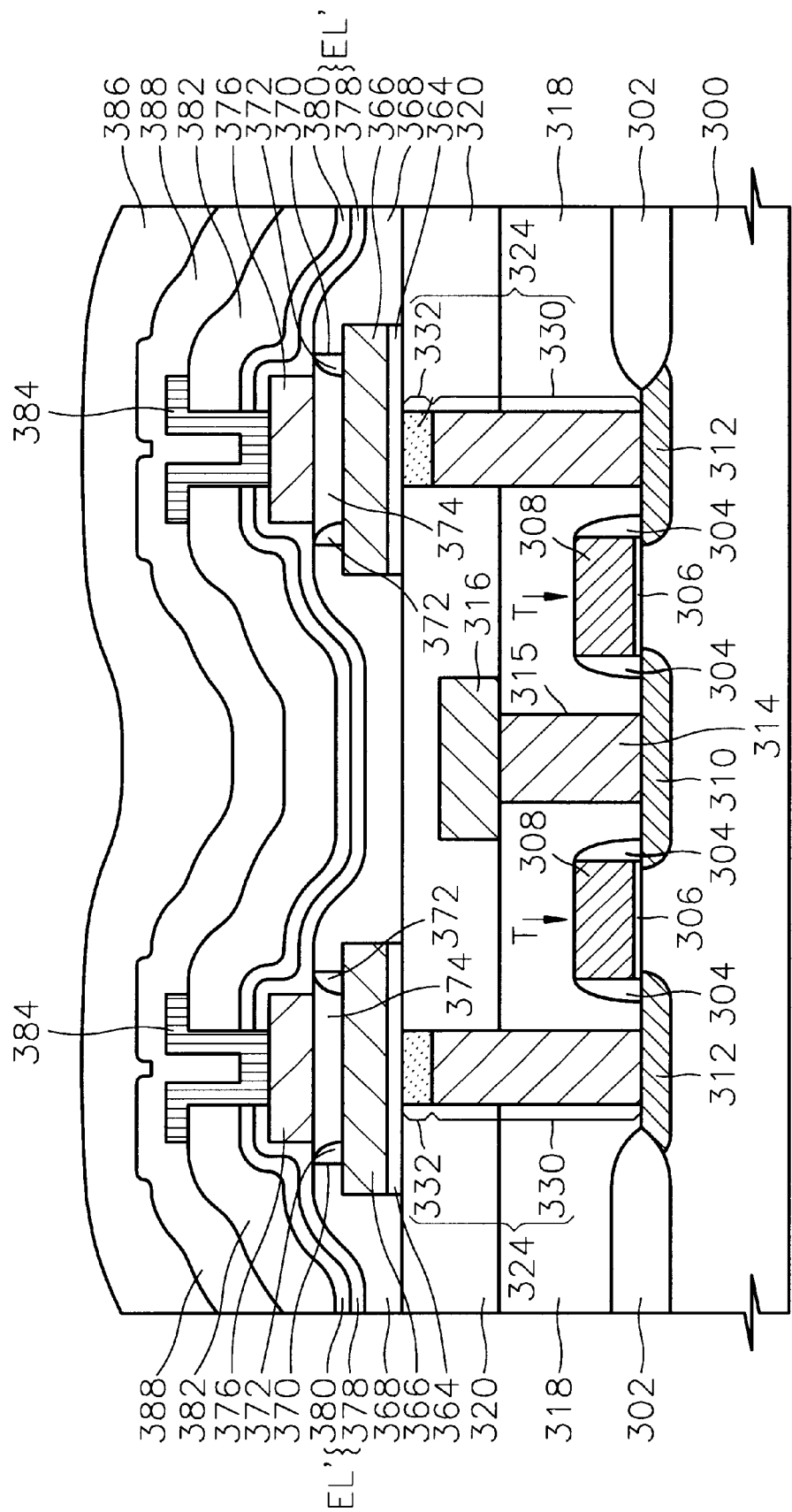
FIG. 5 is a sectional view illustrating a sixth embodiment of a method of manufacturing a semiconductor memory device according to the present invention.

Referring to FIG. 5, a sixth embodiment of the semiconductor memory device manufacturing method according to the present invention is performed by the same steps as in the first embodiment up to the formation of the conductive plug 324 comprising the lower plug 330 and the upper plug 332.

Next, an interface layer pattern 364 and a capacitor lower electrode 366 are formed over the upper plug 332 of the conductive plug 324. In particular, an interface layer and a lower conductive layer are sequentially stacked over the upper plug 332 and the second ILD film 320, which are substantially the same as the interface layer 334 and the lower conductive layer 336 shown in FIG. 3D, respectively. Following this, the interface layer and the lower conductive layer are patterned by photolithography to form the interface layer pattern 364 and the capacitor lower electrode 366.

After the interface layer pattern 364 and the capacitor lower electrode 366 have been formed, a third ILD film 368 is formed over the entire surface of the semiconductor substrate 300 by a general process, for example, a PECVD process. The type of material layer used for the third ILD film 368 is substantially the same as that of the first ILD film 318. Next, the third ILD film 368 is patterned by photolithography to form an opening 370 exposing the top surface of the capacitor lower electrode 366. Then, a diffusion barrier spacer 372 is formed on the sidewalls of the opening 370. The diffusion barrier spacer 372 may be formed of a material layer which is substantially the same as that of the capacitor protection layer 342 shown in FIG. 3H. For example, the diffusion barrier spacer 372 may be formed of an ALD-$Al_2O_3$ layer. The formed diffusion barrier spacer 372 is optionally subjected to a heat treatment process at a temperature of approximately 400 to 600° C. under an oxygen atmosphere so as to stabilize the diffusion barrier spacer 372 for an enhanced function thereof. The opening 370 is filled with a capacitor dielectric layer 374 by a general process, for example, for a sol-gel process. The capacitor dielectric layer 374 may be formed of a material layer which is substantially the same as the capacitor dielectric layer 338' in FIG. 3E. Then, the capacitor dielectric layer 374 is subjected to a heat treatment process, in order to enhance the dielectric properties of the capacitor dielectric layer 374. The heat treatment process on the capacitor dielectric layer 374 may be performed at a temperature of approximately 600 to 800° C. under an oxygen atmosphere. Thereafter, a capacitor upper electrode 376 is formed on the capacitor dielectric layer 374. For the formation of the capacitor upper electrode 376, an upper conductive layer is formed over the entire surface of the semiconductor substrate by a general process, for example, a sputtering process, and patterned by a photolithography process, resulting in the capacitor upper electrode 376. The type, thickness and structure of material layer used for the upper conductive layer, and the process applicable to form the upper conductive layer are substantially the same as those in the formation of the upper conductive layer 340 in FIG. 3D. Thereafter, an encapsulating layer EL' is formed to cover the resultant structure such that it contact with part of the capacitor dielectric layer 374 on which the capacitor upper electrode layer 376 is not formed, and the surface of the capacitor upper electrode 376. It is preferable that the encapsulating layer EL' is formed in a multi-layered structure as with the encapsulating layer EL in FIG. 3H. Also, it is preferable that the encapsulating layer EL' is formed to include at least a blocking layer 378 and a capacitor protection layer 380. The type and thickness of material layer used for the blocking layer 378 and capacitor protection layer 380, and the process applicable to form these layers are substantially the same as in the formation of the blocking layer 342 and capacitor protection layer 344 in FIG. 3H. Also, a heat treatment process may be performed after the formation of the blocking layer 342 and/or the capacitor protection layer 380. The heat treatment process may be performed under the same conditions as in the first embodiment of the semiconductor memory device manufacturing method according to the present invention.

After the encapsulating layer EL' has been formed, a fourth ILD film 382 is formed over the entire surface of the semiconductor substrate 300 by performing an ILD process. The type of material layer used for the fourth ILD film 382 is substantially the same as that used for the first ILD film 318. Next, the fourth ILD film 382 is subjected to a metallization process to form an upper electrode metal contact 384 through the fourth ILD film 382, the upper electrode metal contact 384 being in contact with the capacitor upper electrode 376. Although not shown, a lower electrode metal contact may be formed during this metallization process. Following this, a passivation layer 386 is formed over the semiconductor substrate 300. The type, thickness and structure of material layer which can be used for the passivation layer 386, and the process applicable to form the passivation layer 386 are substantially the same as in the formation of the passivation layer 352 in FIG. 3J.

In a sixth embodiment of the semiconductor memory device manufacturing method according to the present invention, the capacitor dielectric layer 374 is directly covered by the encapsulating layer EL' and the diffusion barrier spacer 372 as the above-described embodiments of the semiconductor memory device manufacturing method according to the present invention, so that the capacitor dielectric layer 374 can be protected from diffusion of the hydrogen based gas which is produced during subsequent ILD and passivation processes.

Alternatively, a hydrogen barrier layer 388 may be formed over the entire surface of the semiconductor substrate 300 prior to performing the passivation process as in the first embodiment. Additionally, although not shown, a buffer layer may be optionally formed over the entire surface of the semiconductor substrate 300 prior to the formation of the hydrogen barrier layer 388. The type, thickness and structure of material layers used for the hydrogen barrier layer 388 and the buffer layer, and the process applicable to form these layers are substantially the same as in the first embodiment of the semiconductor memory device manufacturing method according to the present invention. The formation of the buffer layer and/or the hydrogen barrier layer 388 prior to performing the passivation process, assures more effective protection of the capacitor dielectric layer 374 from hydrogen based gas entering thereinto through the upper electrode metal contact 384.

A seventh embodiment of the semiconductor memory device manufacturing method according to the present invention follows the steps as in the sixth embodiment of the semiconductor memory device manufacturing method, except that the conductive plug 342, which fills the contact hole 322 formed through the first and second ILD films 318 and 320, is fully formed of a refractory metal silicide layer. The formation of the refractory metal silicide layer in the contact hole 322 to pass through the first and second ILD films 318 and 320 was described in the second embodiment of the semiconductor memory device manufacturing method, and thus a description thereof will not be repeated.

An eighth embodiment of the semiconductor memory device manufacturing method according to the present invention differs from the sixth embodiment only in that the conductive plug 324 having a single-layered structure, for example, exclusively formed of doped polysilicon, fills the contact hole 322 passing through the first and second ILD films 318 and 320, and the interface layer pattern 364 has a triple-layered structure in which a conductive layer pattern, a silicide layer pattern and a diffusion barrier layer pattern are sequentially stacked.

For the interface layer pattern 364 having the triple-layered structure, a conductive layer, a silicide layer and a diffusion barrier layer are sequentially deposited over the conductive plug 324 and the second ILD film 320. Here, the process applied to deposit the three layers is substantially the same as in the third embodiment of the semiconductor memory device according to the present invention. Of course, the type and thickness of material used as the conductive layer, the silicide layer and the diffusion barrier layer are substantially the same as in the third embodiment of the semiconductor memory device manufacturing method described previously.

A ninth embodiment of the semiconductor memory device manufacturing method according to the present invention follows the steps as in the seventh embodiment up to the formation of the conductive plug 324 with a single-layered structure, for example, of a doped polysilicon, in the contact hole 322 formed through the first and second ILD films 318 and 320. Thereafter, a doped polysilicon layer and a silicide layer are formed over the conductive plug 324 and the second ILD film 320 by the steps used in the fourth embodiment of the semiconductor memory device manufacturing method. The silicide layer and the doped polysilicon layer are patterned by photolithography, which results in the capacitor lower electrode 366 and the interface layer pattern 364. After the capacitor lower electrode 366 has been formed, steps which are substantially the same as those performed in the sixth embodiment are performed on the structure.

A tenth embodiment of the semiconductor memory device manufacturing method according to the present invention follows the steps as in the seventh embodiment up to the formation of the conductive plug 324 with a single layered structure, for example, of doped polysilicon, in the contact hole 322 formed through the first and second ILD films 318 and 320. Thereafter, a silicide layer and a diffusion barrier layer are sequentially deposited over the conductive plug 324 and the second ILD film 320, and patterned into an interface layer pattern 364 by a photolithography process. The same steps as in the sixth embodiment of the semiconductor memory device manufacturing method are carried out on the structure to form a semiconductor memory device.

Figure 6:
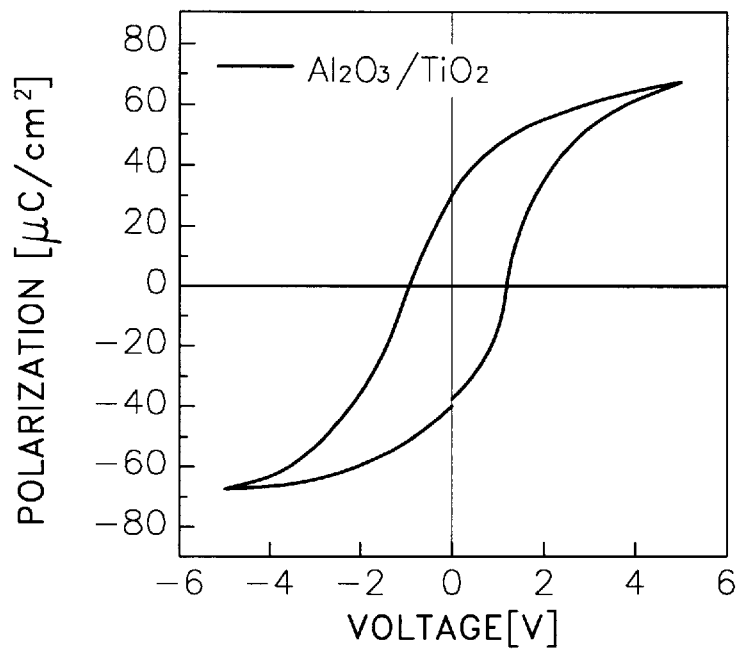
FIGS. 6 and 7 are graphs showing the hysteresis loop of a capacitor dielectric layer of a capacitor and leakage current characteristics of the capacitor, respectively, with respect to Sample C1 manufactured by a method according to the present invention.
Figure 7:
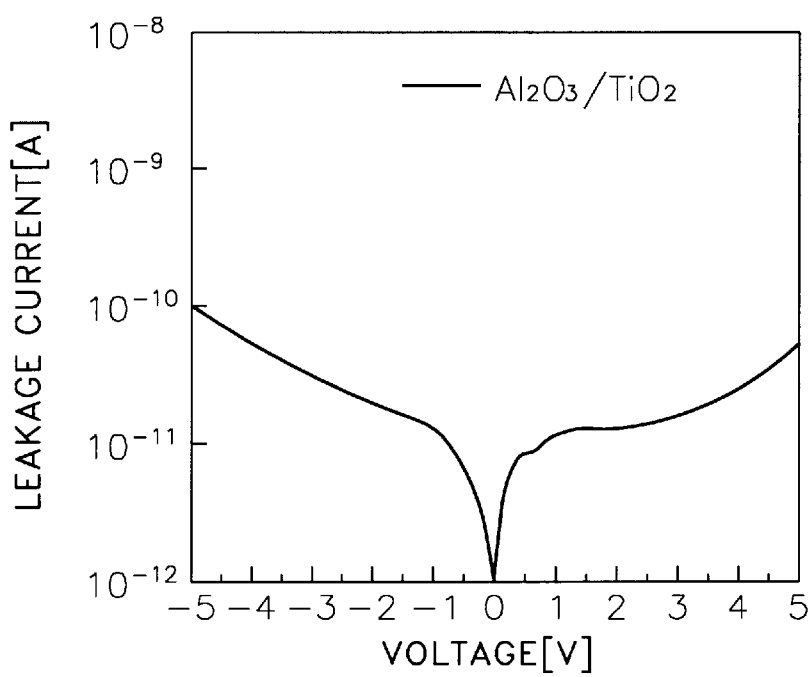

Hereinafter, the effectiveness of the bilayered EL in the point of preventing the deterioration of the capacitor C by the hydrogen based gas produced during the ILD process, IMD process and the like, will be described through the following experimental examples. To this end, Sample 1 was formed under the following conditions. Then, the degree of polarization and leakage current of a capacitor were measured while applying a voltage of −5~5 volts to the capacitor of Sample 1. The results are shown in FIGS. 6 and 7.

Sample 1 was manufactured by the following procedures. Initially, a ferroelectric capacitor was formed on a semiconductor substrate. The area of the capacitor was $1.44\times10^{-6} cm^2$ and a capacitor dielectric layer was formed of PZT to have a thickness of approximately 2000 Å. The upper electrode of the capacitor was a bilayer of an Ir layer and an $IrO_2$ layer, and the thicknesses of these layers were 1200 Å and 300 Å, respectively. The lower electrode of the capacitor was also a bilayer of Pt and $IrO_2$ layers, and the thicknesses of these layers were 1500 Å and 500 Å, respectively.

Next, a bilayered encapsulating layer EL was formed. That is, a blocking layer was formed of a $TiO_2$ layer to have a thickness of approximately 1000 Å by a sputtering process, and heat-treated at 450° C. for 30 minutes in an $O_2$ atmosphere. Thereafter, a capacitor protection layer was formed of an $Al_2O_3$ layer to have a thickness of approximately 120 Å by an ALD process.

Thereafter, the ILD process, during which hydrogen source gas was derived, was performed to form a interlayer dielectric layer on the entire surface of the semiconductor substrate, and then a contact hole which partially exposed the upper and lower electrodes, was formed. In order to repair damage caused during the formation of the contact hole, Sample 1 was heat-treated at 450° C. for 30 minutes in an oxygen atmosphere. Following this, an upper electrode metal contact and a lower electrode metal contact were formed.

Referring to FIG. 6, as can be inferred from the remaining polarization value of about 25 $\mu C/cm^2$, which is nearly the same as the initial level, the capacitor dielectric layer is not deteriorated by performing the ILD process after the formation of the bilayered encapsulating layer EL of the $TiO_2$ and $Al_2O_3$ layers. This result confirms that the bilayered encapsulating layer EL prevents deterioration of the capacitor dielectric layer.

Referring to FIG. 7, it can be seen that the leakage current of the capacitor is about $10^{-10}$ ampere at a voltage of 1~4 volts. That is, it can be ascertained that the leakage current of the capacitor shows a stable distribution within the operational voltage range of the semiconductor memory device. From this result, it can also be concluded that the bilayered encapsulating layer EL prevents deterioration of the capacitor dielectric layer.

Samples 2 and 3 were manufactured for comparison with Sample 1. For convenience of comparison, $TiO_2$ and $Al_2O_3$ layers, both of which were formed as the blocking layer and the capacitor protection layer, respectively, in Sample 1 were separately formed as single encapsulating layers EL of Samples 2 and 3, respectively, by the same methods used to form Sample 1. That is, the encapsulating layer EL of Sample 2 was formed exclusively of $TiO_2$ by a sputtering process, and the encapsulating layer EL of Sample 3 was formed exclusively of $Al_2O_3$ by an ALD process.

In detail, to manufacture Samples 2 and 3, a capacitor forming process was performed to form a capacitor on a semiconductor substrate under the same conditions as for Sample 1. Then, an encapsulating layer EL was formed as a single layer. Each single layered encapsulating layer EL of Samples 2 and 3 was formed under the following conditions.

In the case of Sample 2, the encapsulating layer EL was formed of a $TiO_2$ layer to have a thickness of approximately 1000 Å by a sputtering process. Following this, the encapsulating layer EL was heat-treated at 650° C. for 30 minutes in an $O_2$ atmosphere. Here, the temperature of the heat treatment process was further increased compared to the formation of the blocking layer of Sample 1.

In the case of Sample 3, the encapsulating layer EL was formed of an $Al_2O_3$ layer to have a thickness of approximately 120 Å by an ALD process. Here, $Al(CH_4)_3$ and $H_2O$ gases were used as an aluminum source gas and an oxygen source gas, respectively. However, a heat treatment process was not performed on the encapsulating layer EL of Sample 3.

Then, ILD and metallization processes were performed on both Samples 2 and 3 in the same manner as for Sample 1, to form a lower electrode metal contact and an upper electrode metal contact. Thereafter, the degree of polarization of Samples 2 and 3 was measured while varying the voltage, as in the case of Sample 1, so that hysteresis loops (indicated by $S_2$ and $S_3$ of FIG. 8, respectively) were obtained. The hysteresis loop of Sample 1 (indicated by $S_1$) is also shown in FIG. 8.

Figure 9:
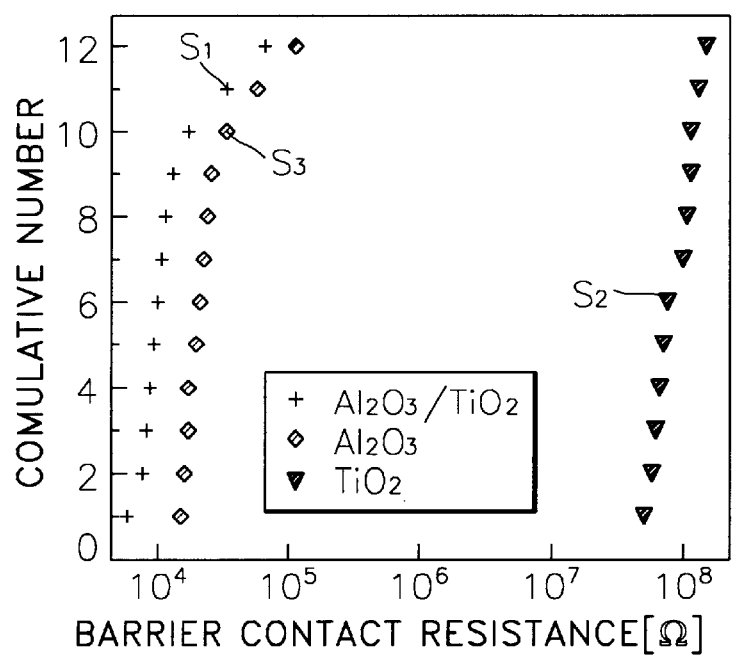

Also, 12 chip dies were selected from each of Samples 1, 2 and 3, and barrier contact resistance was measured. The result is shown in FIG. 9. In FIG. 11 the barrier contact resistance of Samples 1, 2 and 3 is indicated by $S_1$, $S_2$ and $S_3$, respectively.

Figure 8:
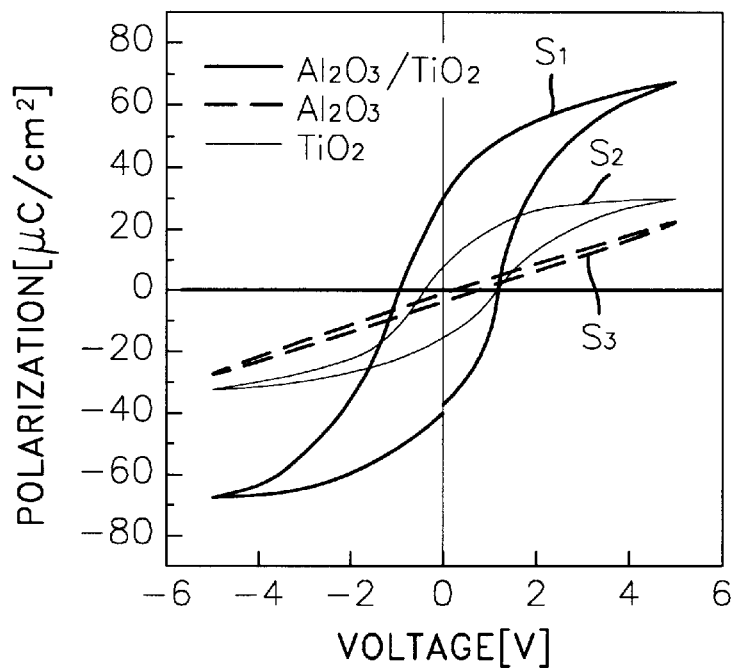
FIGS. 8 and 9 are graphs showing the hysteresis loop and barrier contact resistance, respectively, for Sample C1 manufactured by the method according to the present invention and for Samples C2 and C3 made by different methods.

As shown in FIG. 8, the area of the hysteresis loop of Sample 2, indicated by $S_2$, is smaller than that of Sample 1, indicated by $S_1$. This means that the ferroelectric characteristics of the capacitor dielectric layer of Sample 2 were deteriorated during the ILD process in contrast to Sample 1. Also, from the remaining polarization value of Sample 3, indicated by $S_3$, which is almost zero, it can be inferred that the ferroelectric characteristics of the capacitor dielectric layer of Sample 3 were almost completely deteriorated. From these results, the following conclusion can be made.

First, the encapsulating layer EL ($TiO_2$ layer) of Sample 2 can block diffusion of hydrogen during the ILD process. However, such blocking effect is weak compared to Sample 1 which has a bilayered encapsulating layer EL including $TiO_2$ and $Al_2O_3$ layers.

Second, the temperature of the heat treatment process on the blocking layer ($TiO_2$ layer) of Sample 1 is lower than that of the encapsulating layer EL ($TiO_2$ layer) of Sample 2. Thus, insulation characteristics of the blocking layer of Sample 1 are poor compared to that of the encapsulating layer EL of Sample 2. However, the effect of blocking hydrogen is good in Sample 1, irrespective of the poor insulation characteristics compared to Sample 2. This means that the function of blocking the diffusion of hydrogen is performed primarily by the capacitor protection layer of Sample 1.

Third, even in the case that the insulation characteristics of the encapsulating layer EL(Sample 2) is improved by high-temperature heat treatment process at 600° C. or more after the formation of a single layered encapsulating layer EL, the problem of deterioration of the capacitor by hydrogen diffusion cannot be completely prevented.

Fourth, the deterioration of the capacitor dielectric layer in Sample 3 is related to the process applied to form the encapsulating layer EL ($Al_2O_3$ layer). That is, the reason for the deterioration is the use of $H_2O$ gas as the oxygen source gas. Meanwhile, in the case of Sample 1, the capacitor protection layer is formed after the formation of the blocking layer. That is, because the capacitor is covered with the blocking layer, the $H_2O$ gas can be used as the oxygen source gas in the formation of the capacitor protection layer ($Al_2O_3$ layer) by an ALD method without causing deterioration of the capacitor dielectric layer.

As shown in FIG. 9, the barrier contact resistance of Sample 1 was lower than that of Sample 3. Also, the barrier contact resistance of Sample 2 is increased to the extent of approximately 1 M$\Omega$ or more. The following conclusion can be drawn from the result of FIG. 12.

First, the temperature (450° C.) of the heat treatment process in the formation of the blocking layer of Sample 1 is lower than the temperature (600° C.) of the heat treatment process in the formation of the encapsulating layer EL of Sample 2. That is, the increase of the barrier contact resistance of Sample 2 is due to diffusion of oxygen into the contact plug by the high-temperature heat treatment process of the encapsulating layer EL.

Second, the encapsulating layer EL ($Al_2O_3$ layer) of Sample 3 is more effective at preventing diffusion of oxygen than the encapsulating layer EL ($TiO_2$ layer) of Sample 2. The capability of blocking the diffusion of oxygen is excellent in the encapsulating layer EL of Sample 1 even though the encapsulating layer EL of Sample 3 is formed under the same conditions as those in the formation of the capacitor protection layer of Sample 1. Thus, the effect of blocking the diffusion of oxygen can be improved by forming the encapsulating layer EL as a bilayer.

In an aspect of the semiconductor memory device according to the present invention, the deterioration of the capacitor dielectric layer due to hydrogen attack during the integration processes, which is performed after the formation of the capacitor, can be prevented. In another aspect of the semiconductor memory device according to the present invention, since the semiconductor memory device according to the present invention has a barrier layer for low contact resistance, such as a cobalt silicide layer, the operating speeds of the device can be raised.

In an aspect of the manufacture of a semiconductor memory device according to the present invention, the capacitor can be protected from hydrogen based gas by covering the capacitor with an encapsulating layer having a multi-layered structure. In other words, the deterioration of the capacitor dielectric layer due to hydrogen based gas, which is produced in the subsequent integration processes performed after the capacitor formation, can be prevented. In another aspect of the manufacture of a semiconductor memory device according to the present invention, the increase in contact resistance of the semiconductor memory device during a high-temperature heat treatment process under an oxygen atmosphere is avoided. Further, if a buffer layer and/or a hydrogen barrier layer are formed before the passivation layer formation, the deterioration of the capacitor dielectric layer due to hydrogen produced during the passivation process can be prevented.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device comprising:
   a capacitor having a lower electrode, an upper electrode and a capacitor dielectric layer interposed between the lower and upper electrodes;
   an encapsulating layer that extends on said capacitor and contacts the lower electrode, the upper electrode and the capacitor dielectric layer, said encapsulating layer comprising a composite of at least two metal oxide layers that are different from each other and different from the capacitor dielectric layer;
   a dielectric layer that extends on said encapsulating layer;
   a contact hole that extends through said dielectric layer and said encapsulating layer; and
   a metal contact that extends through said contact hole, contacts sidewalls of the at least two different metal oxide layers and is electrically connected to the upper electrode.

2. The semiconductor memory device of claim 1, wherein each of the at least two different metal oxide layers has a thickness of about 50 to 1500 Å.

3. The semiconductor memory device of claim 1, further comprising a passivation layer over the metal contact and the dielectric layer.

4. The semiconductor memory device of claim 3, further comprising a hydrogen barrier layer interposed between the metal contact and the passivation layer.

5. The semiconductor memory device of claim 4, wherein the hydrogen barrier layer is a metal oxide layer.

6. The semiconductor memory device of claim 4, wherein the hydrogen barrier layer is formed of an $Al_2O_3$ layer, a $TiO_2$ layer, a $Ta_2O_5$ layer, a $BaTiO_3$ layer, a $SrTiO_3$ layer, a $Bi_4Ti_3O_{12}$ layer or a $PbTiO_3$ layer.

7. The semiconductor memory device of claim 4, further comprising a buffer layer interposed between the metal contact and the hydrogen barrier layer.

8. The semiconductor memory device of claim 1, wherein the capacitor lower electrode is formed of a cobalt silicide layer.

9. The semiconductor memory device of claim 1, further comprising:

an interlayer dielectric film under the capacitor;

a conductive plug formed through the interlayer dielectric film, the conductive plug being electrically connected to the capacitor lower electrode; and an interface layer formed of a cobalt suicide layer between the capacitor lower electrode and the conductive plug.

10. The semiconductor memory device of claim 1, further comprising:

an interlayer dielectric layer under the capacitor; and a conductive plug formed through the interlayer dielectric film, the conductive plug being electrically connected to the capacitor lower electrode, wherein the conductive plug is formed exclusively of a cobalt silicide layer or of a bilayer of a conductive layer and a cobalt silicide layer.

11. A semiconductor memory device, comprising:

a semiconductor substrate;

a capacitor on said semiconductor substrate, said capacitor comprising a first capacitor electrode, a ferroelectric dielectric layer on the first capacitor electrode and a second capacitor electrode on the ferroelectric dielectric layer;

a first non-ferroelectric metal oxide layer that covers said capacitor and contacts the first capacitor electrode, the ferroelectric dielectric layer and the second capacitor electrode;

a second non-ferroelectric metal oxide layer that covers said capacitor and contacts said first non-ferroelectric metal oxide layer, said first and second non-ferroelectric metal oxide layers comprising differential metal oxide materials;

a non-metal oxide electrically insulating layer that covers said capacitor;

a contact hole that extends through said non-metal oxide electrically insulating layer, said second non-ferroelectric metal oxide layer and said first non-ferroelectric metal oxide layer and exposes an upper surface of the second capacitor electrode; and a metal contact that extends through said contact hole and electrically contacts the upper surface of the second capacitor electrode.

12. The memory device of claim 11, further comprising a hydrogen barrier layer that covers said capacitor and said metal contact, said hydrogen barrier layer comprising a metal oxide.

13. The memory device of claim 1, wherein an outer one of the at least two metal oxide layers comprises aluminum oxide.

* * * * *